(12) United States Patent
Lim et al.

(10) Patent No.: US 11,329,205 B2
(45) Date of Patent: May 10, 2022

(54) LIGHT EMITTING DEVICE PACKAGE

(71) Applicant: SUZHOU LEKIN SEMICONDUCTOR CO., LTD., Suzhou (CN)

(72) Inventors: Chang Man Lim, Seoul (KR); June O Song, Seoul (KR); Ki Seok Kim, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 16/768,304

(22) PCT Filed: Nov. 30, 2018

(86) PCT No.: PCT/KR2018/015073
§ 371 (c)(1),
(2) Date: May 29, 2020

(87) PCT Pub. No.: WO2019/108010
PCT Pub. Date: Jun. 6, 2019

(65) Prior Publication Data
US 2021/0193890 A1  Jun. 24, 2021

(30) Foreign Application Priority Data
Dec. 1, 2017 (KR) .................. 10-2017-0164415

(51) Int. Cl.
*H01L 33/62* (2010.01)
*H01L 33/48* (2010.01)
(Continued)

(52) U.S. Cl.
CPC ............ *H01L 33/62* (2013.01); *H01L 33/486* (2013.01); *H01L 33/50* (2013.01); *H01L 33/52* (2013.01); *H01L 33/60* (2013.01)

(58) Field of Classification Search
CPC ........................... H01L 33/62; H01L 23/5384
See application file for complete search history.

(56) References Cited

U.S. PATENT DOCUMENTS

2006/0220050 A1  10/2006  Higaki et al.
2012/0138988 A1*  6/2012  Lee .................... H01L 33/06
                                                                    257/98
2019/0081221 A1   3/2019  Jeon et al.

FOREIGN PATENT DOCUMENTS

JP     2015-226056 A    12/2015
KR  10-2015-0140027 A   12/2015
(Continued)

OTHER PUBLICATIONS

Frame. (n.d.) American Heritage® Dictionary of the English Language, Fifth Edition. (2011). Retrieved Jul. 23, 2021 from https://www.thefreedictionary.com/frame (Year: 2011).*
(Continued)

*Primary Examiner* — Jay C Chang
*Assistant Examiner* — Mikka Liu
(74) *Attorney, Agent, or Firm* — Birch, Stewart, Kolasch & Birch, LLP

(57) ABSTRACT

A light emitting device package according to an embodiment may include first and second frames, a body, a light emitting device, first and second conductive parts, and first and second conductors. According to the embodiment, first and second frames may be spaced apart from each other and include first and second openings, respectively. The body may be disposed between the first and second frames. The light emitting device may be disposed on the body and include first and second bonding parts. The first and second conductive parts may be disposed under the first and second bonding parts. The first and second conductors may be disposed in the first and second openings, respectively. According to the embodiment, the first and second conduc-
(Continued)

tive parts may extend into the first and second openings from the first and second bonding parts, respectively, and the first and second conductors may be disposed between the first and second conductive parts and the first and second frames, respectively.

18 Claims, 20 Drawing Sheets

(51) Int. Cl.
*H01L 33/50* (2010.01)
*H01L 33/52* (2010.01)
*H01L 33/60* (2010.01)

(56) References Cited

FOREIGN PATENT DOCUMENTS

| KR | 10-2016-0037472 A | 4/2016 |
|----|-------------------|--------|
| KR | 10-2016-0054333 A | 5/2016 |
| WO | WO 2017/155282 A1 | 9/2017 |

OTHER PUBLICATIONS

International Search Report (PCT/ISA/210) issued in PCT/KR2018/015073, dated Mar. 15, 2019.

* cited by examiner

[FIG. 1]
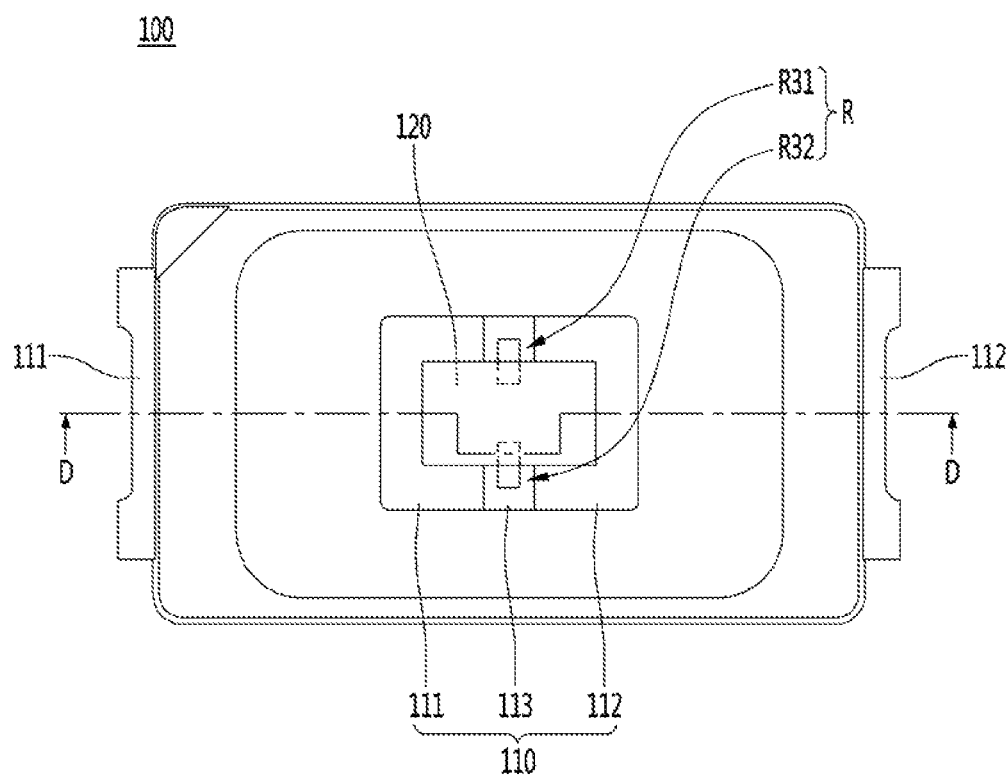

[FIG. 2]
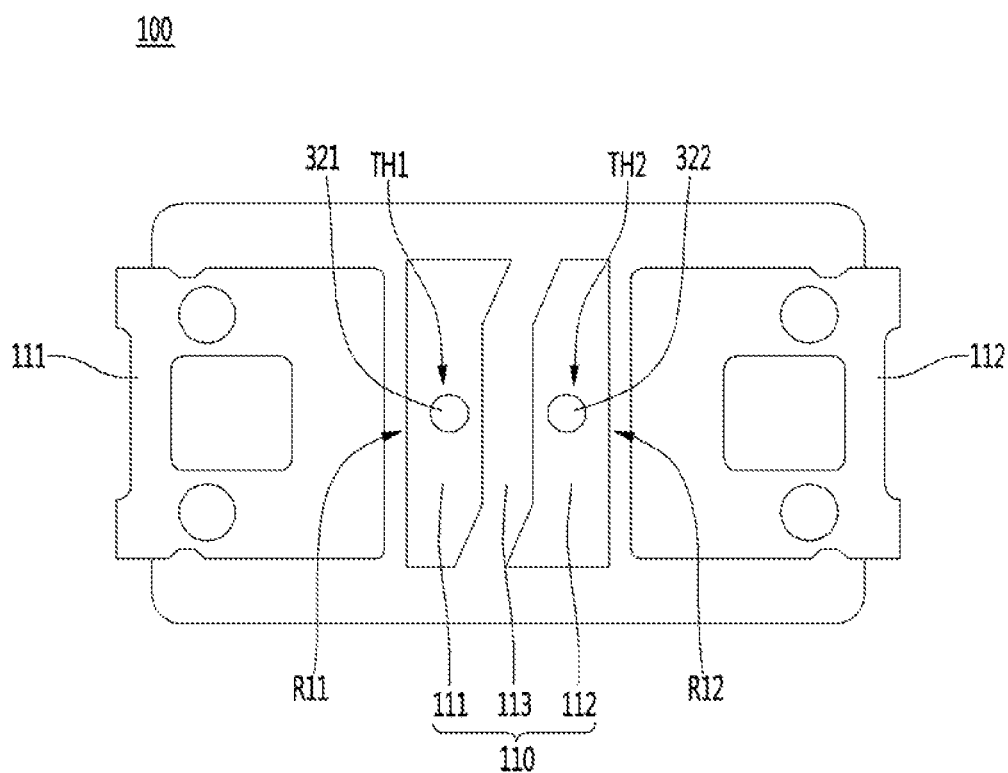

[FIG. 3]
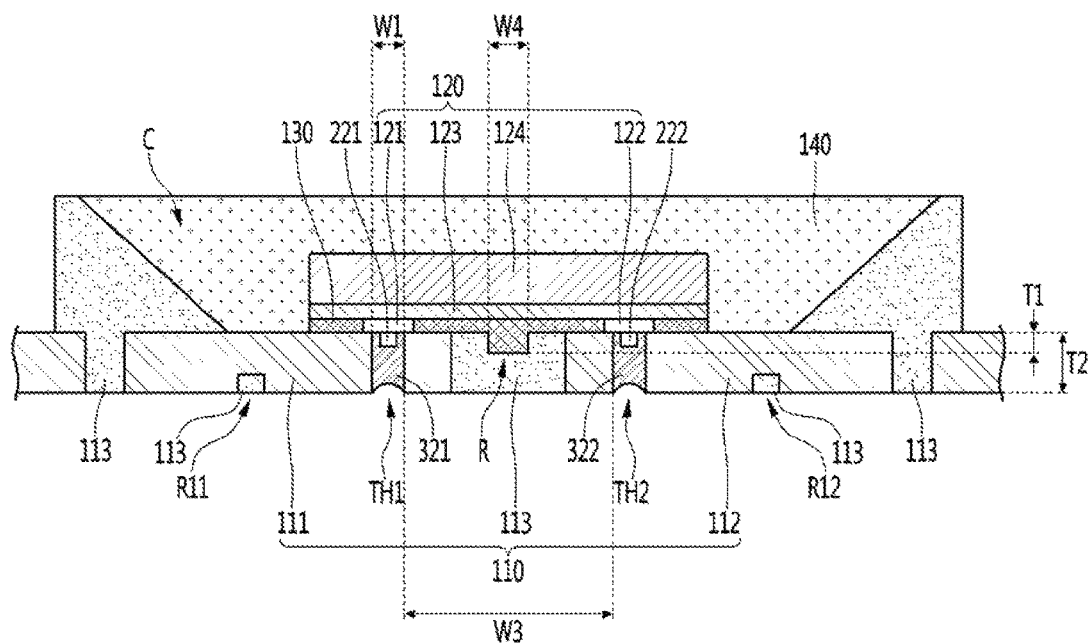

[FIG. 4]
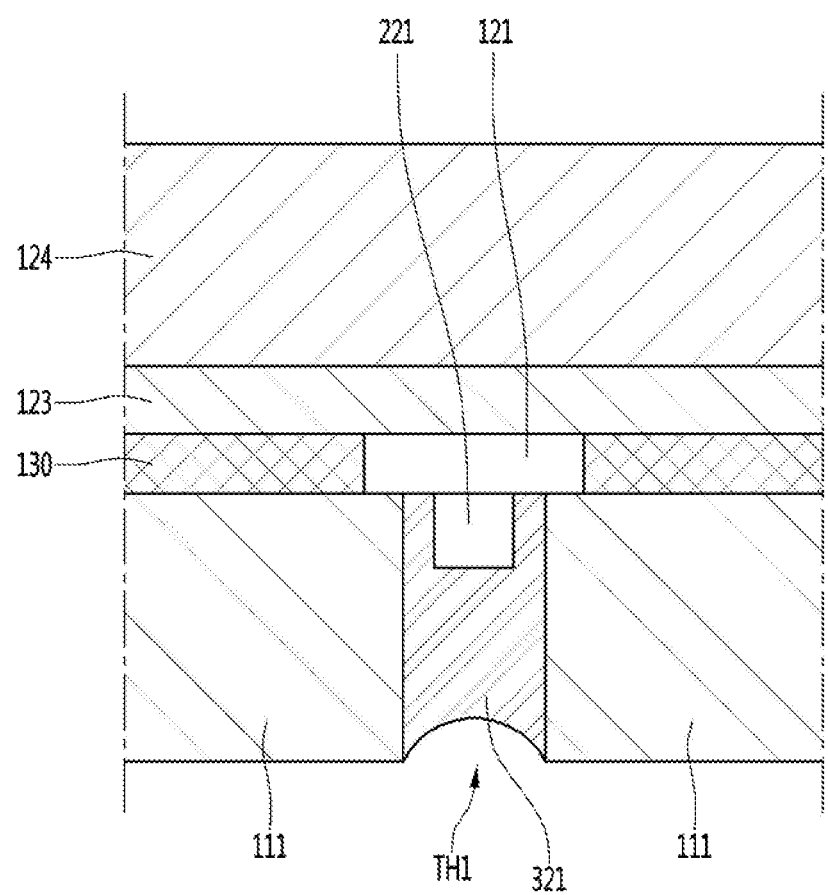

[FIG. 5]
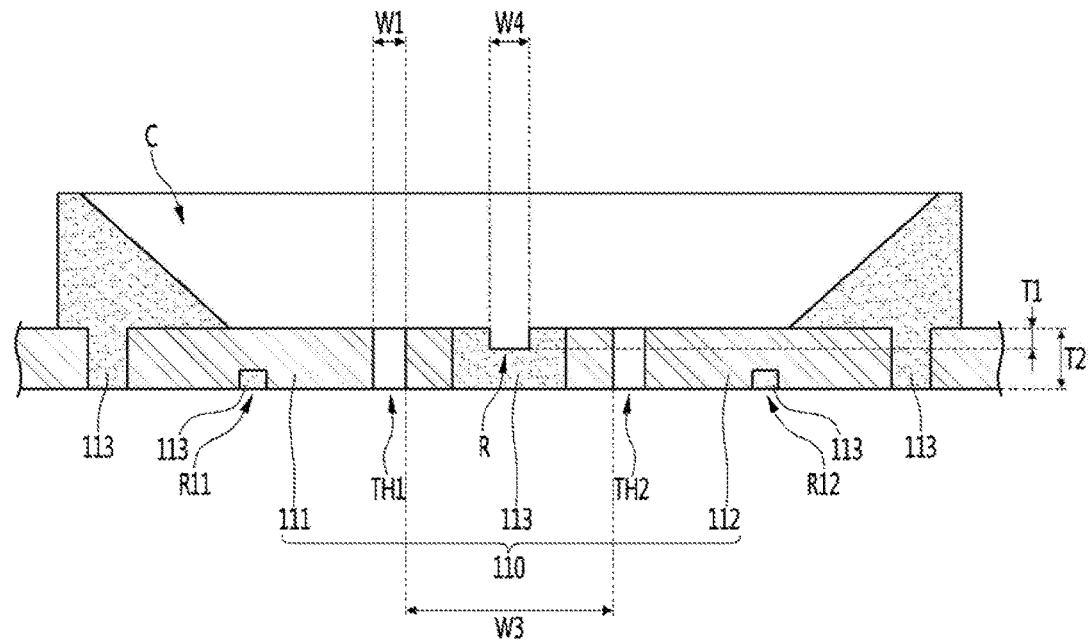
[FIG. 6]
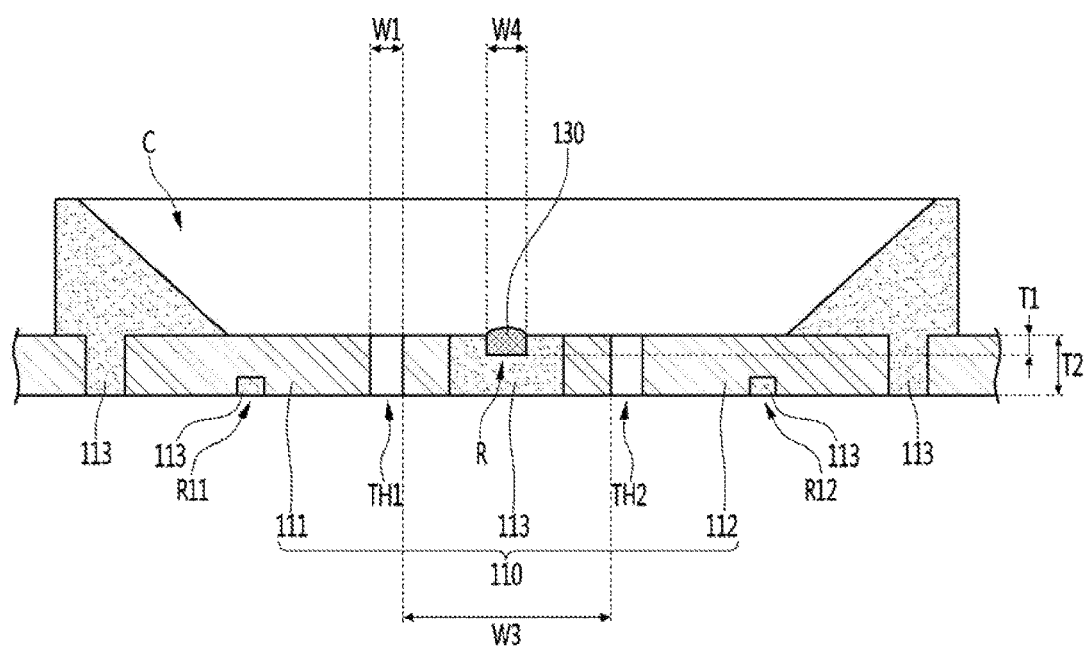

[FIG. 7]
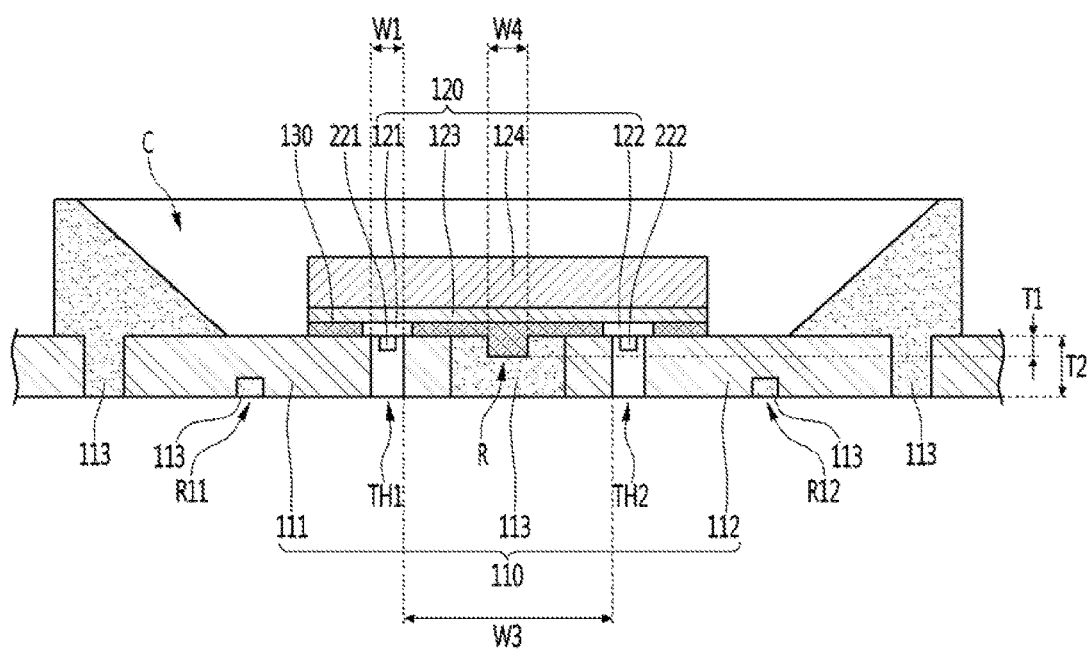

[FIG. 8]
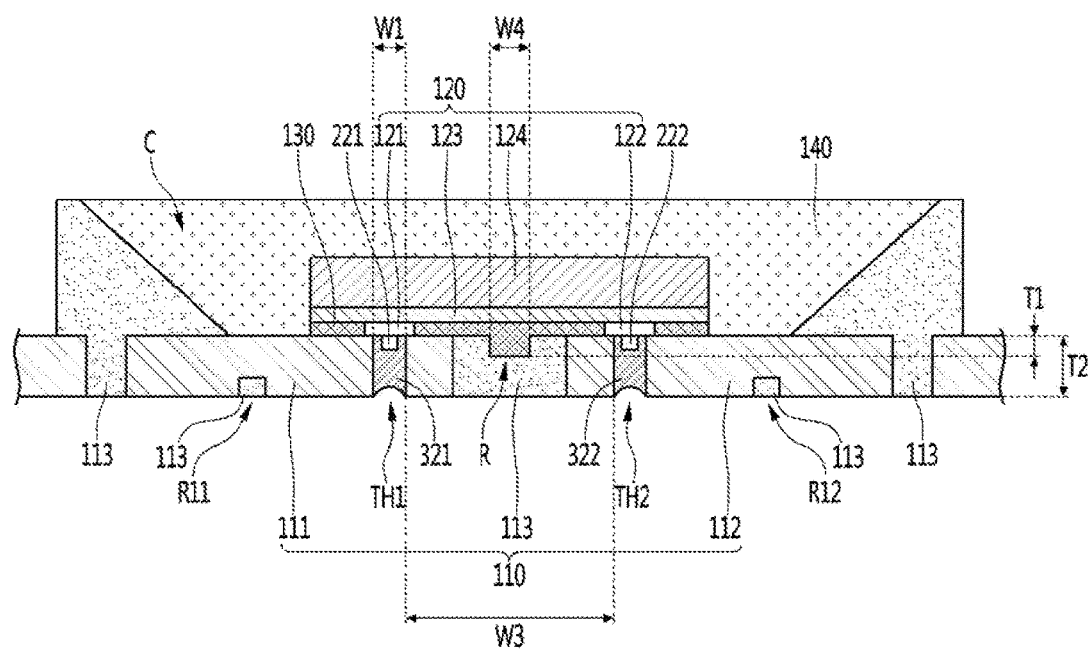

[FIG. 9]
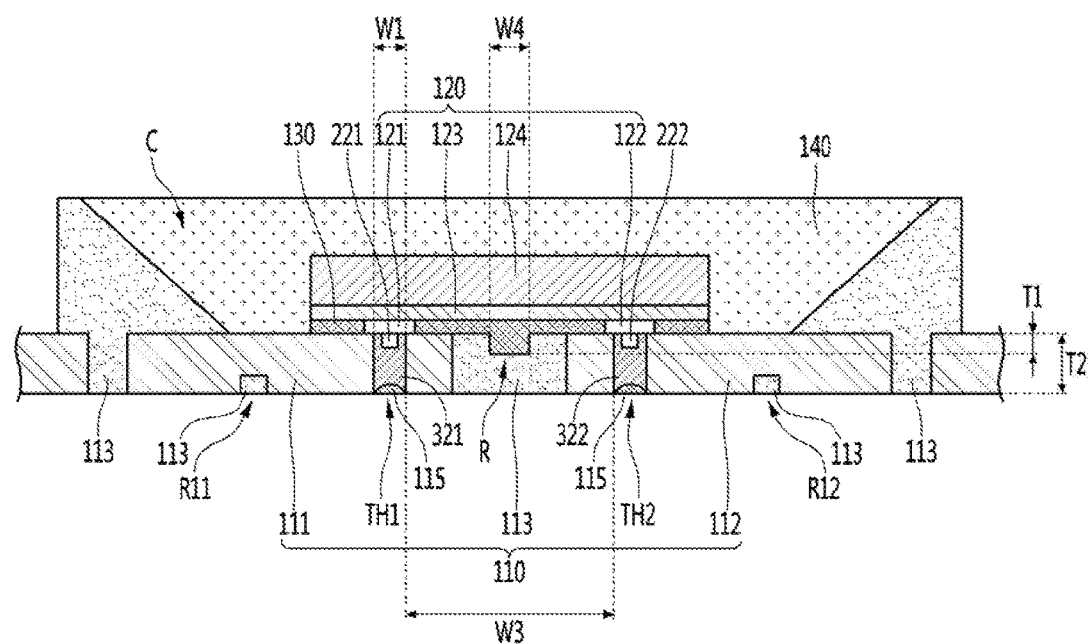

[FIG. 10]
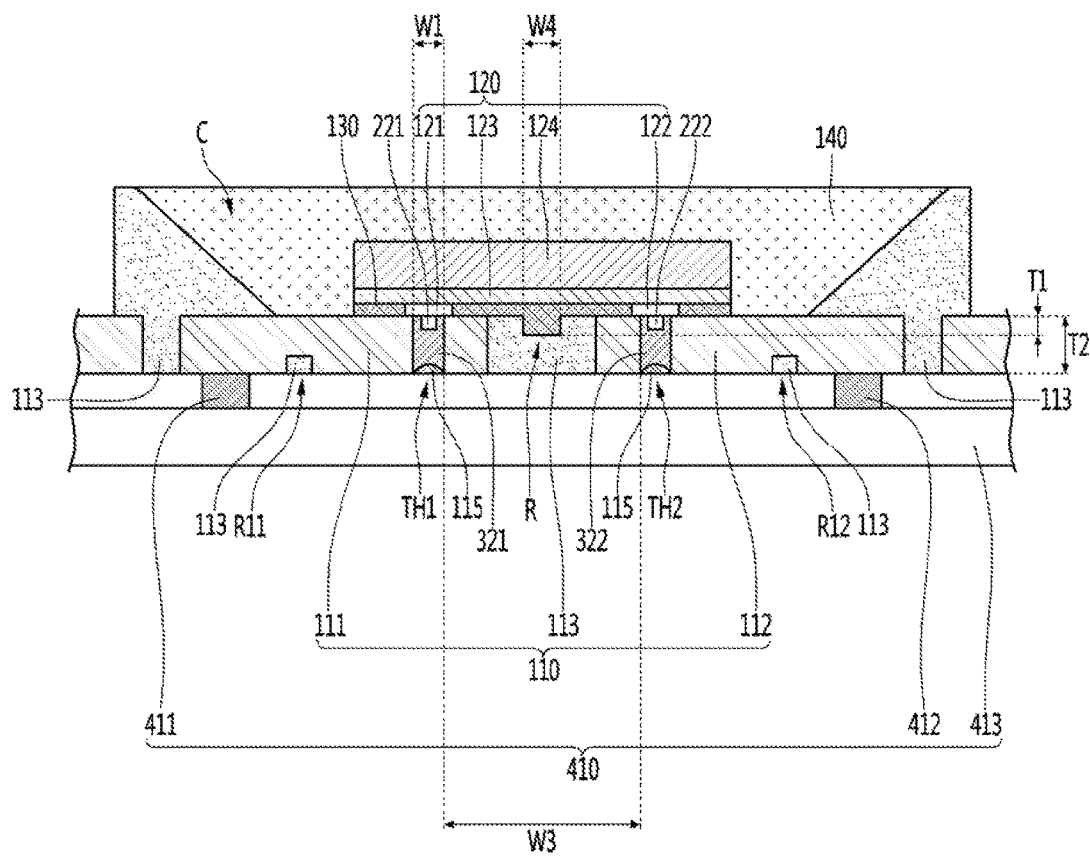

[FIG. 11]
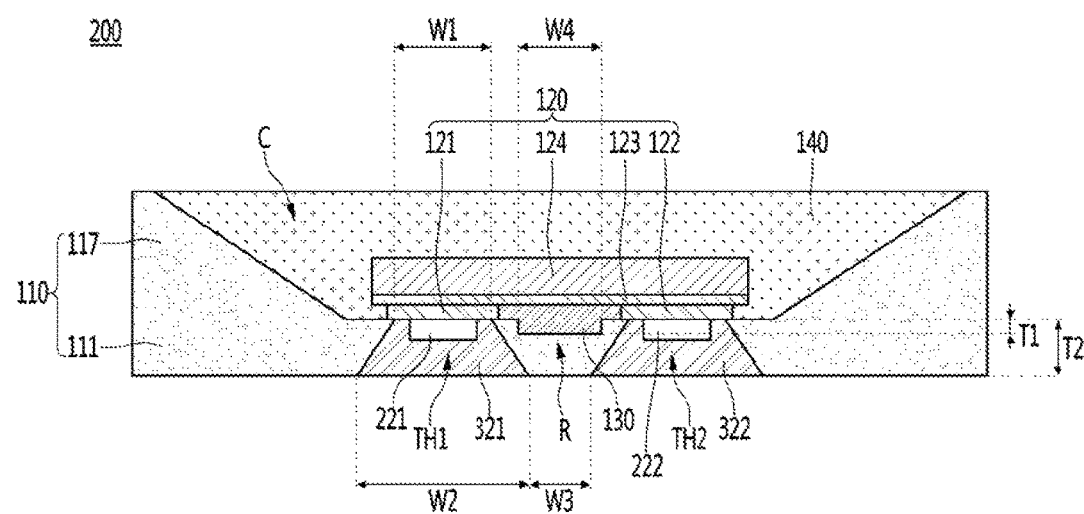

[FIG. 12]
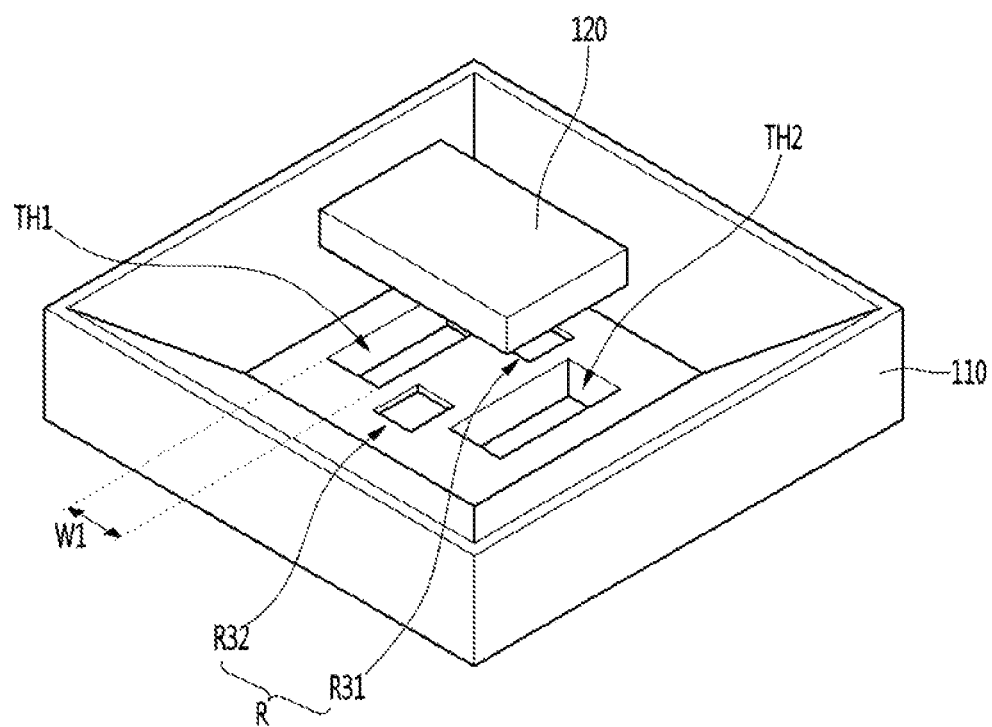

[FIG. 13]
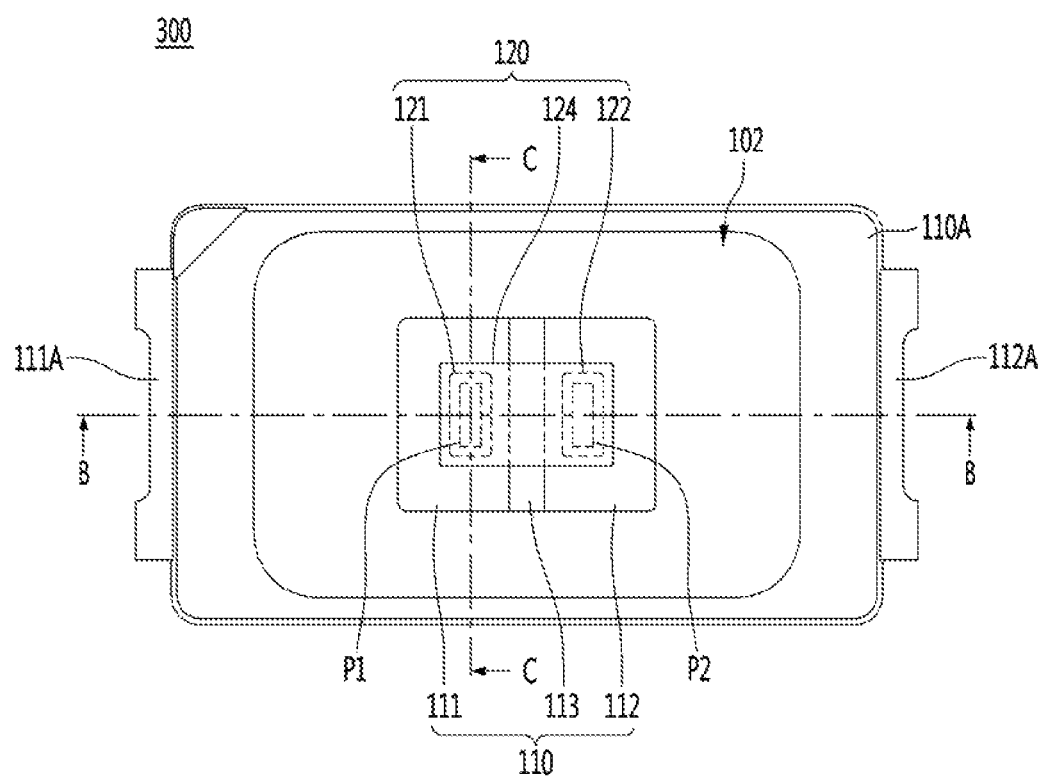

[FIG. 14]
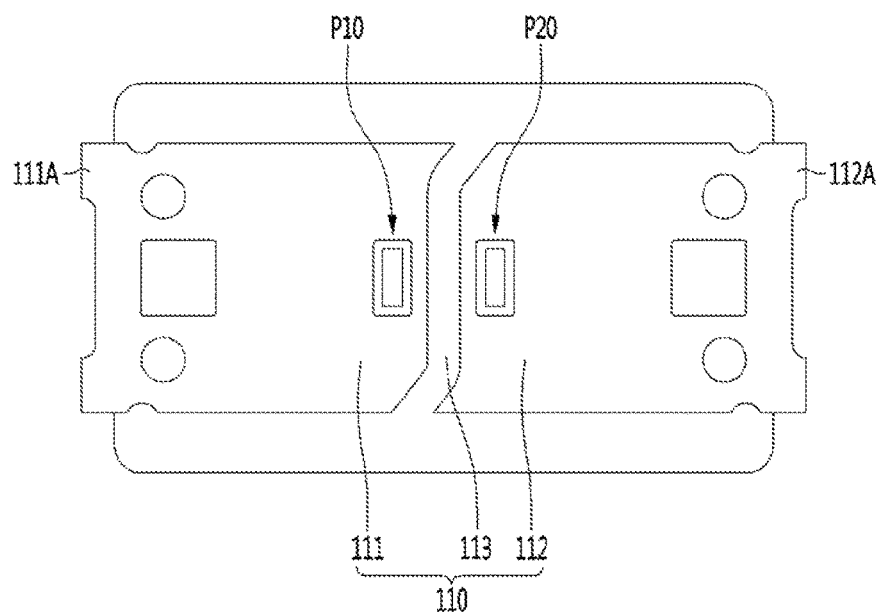
[FIG. 15]
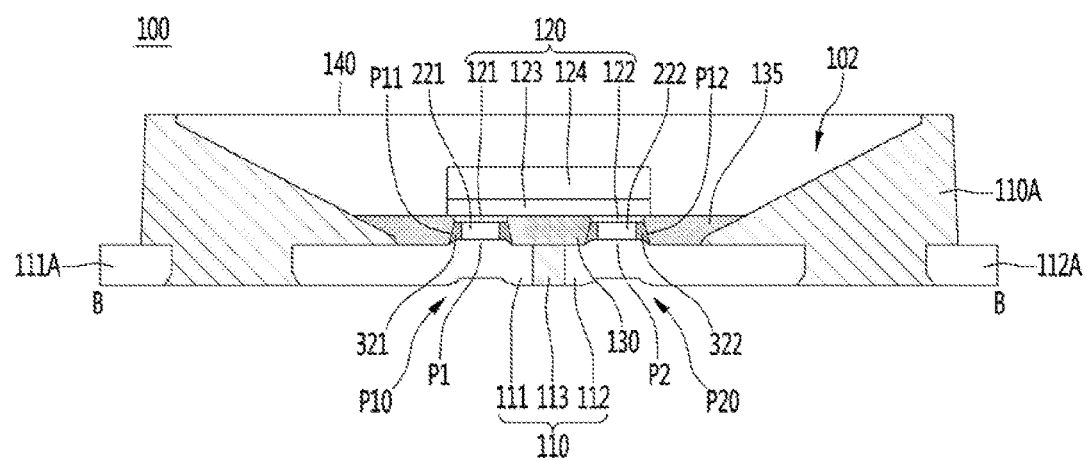

[FIG. 16]
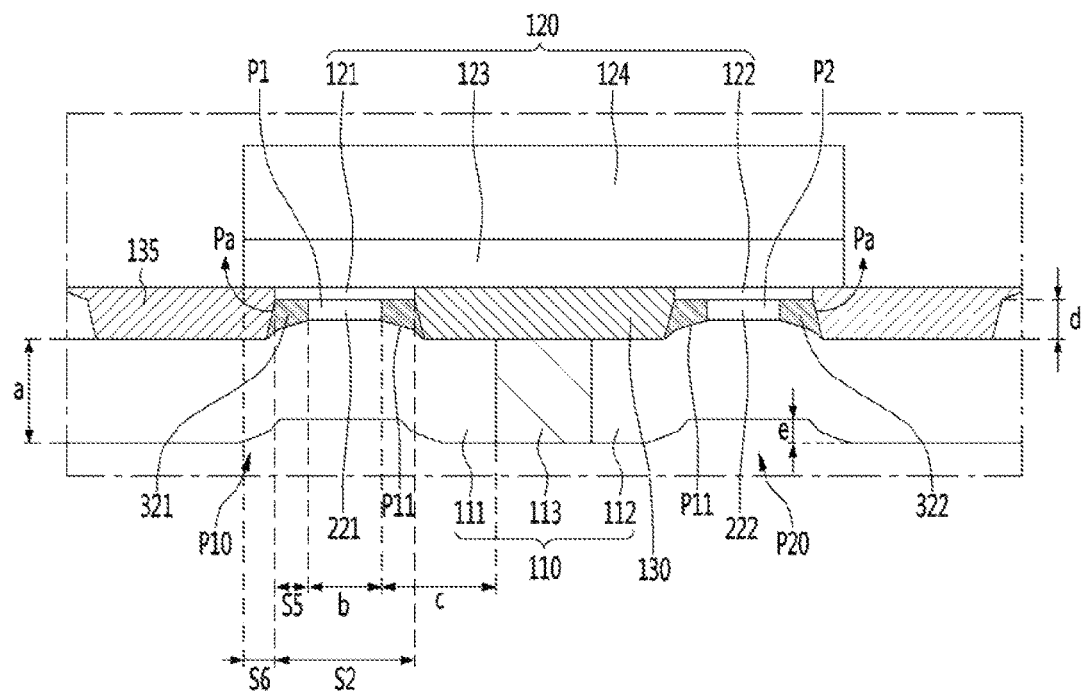

[FIG. 17]
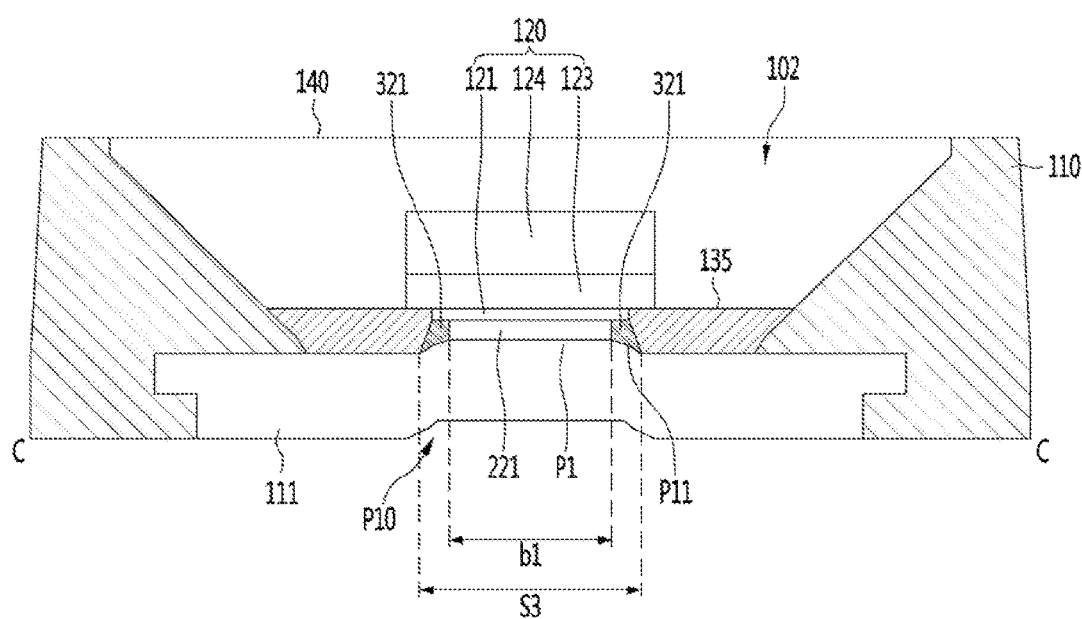

[FIG. 18]
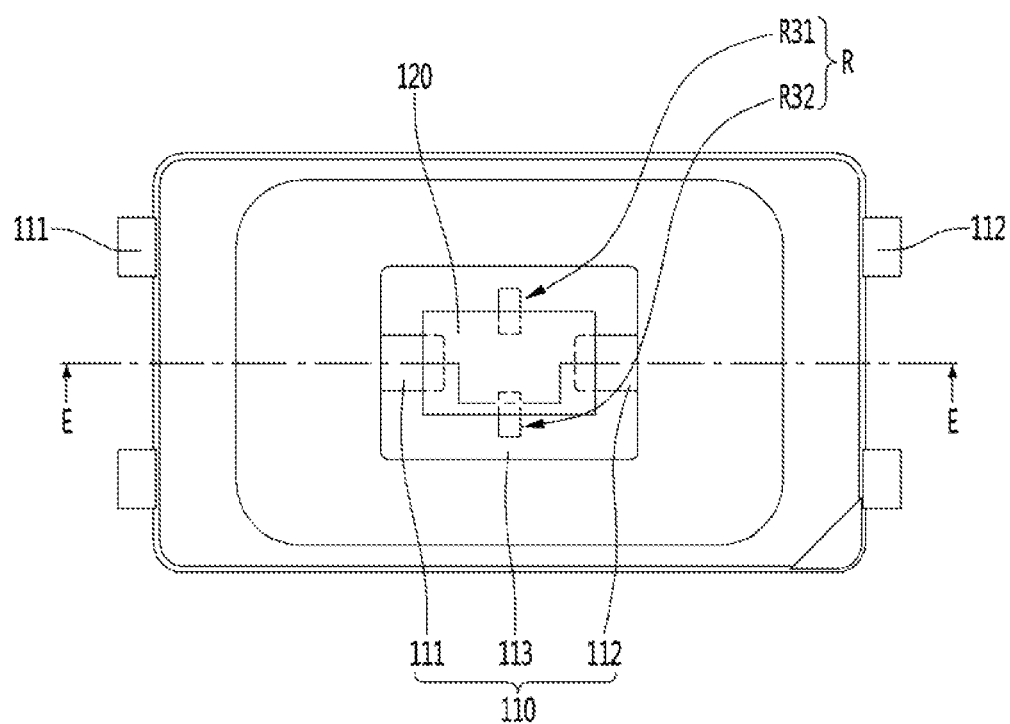

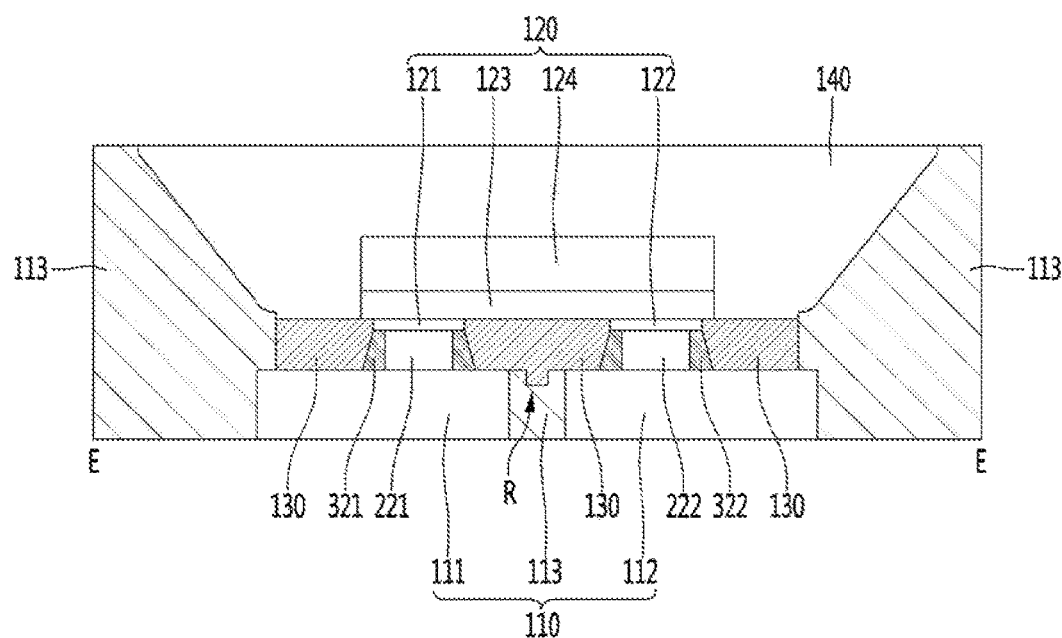
[FIG. 19]

[FIG. 20]
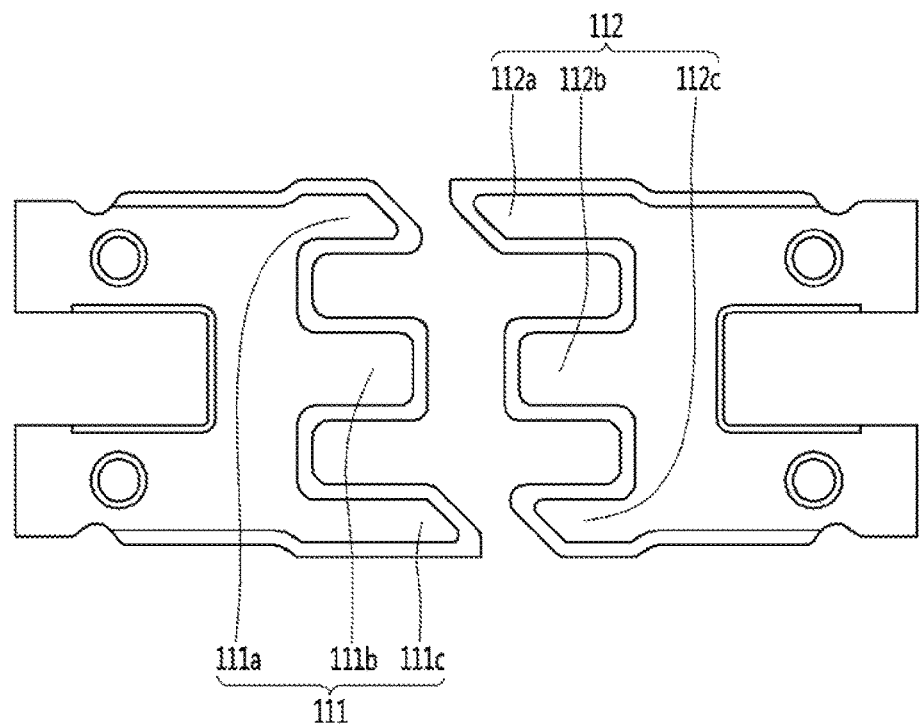
[FIG. 21]
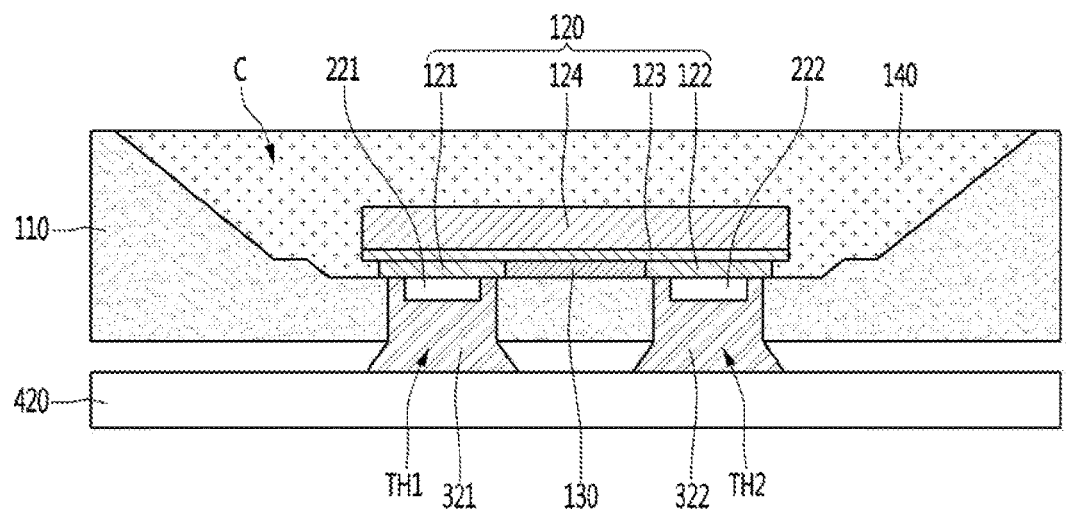

[FIG. 22]
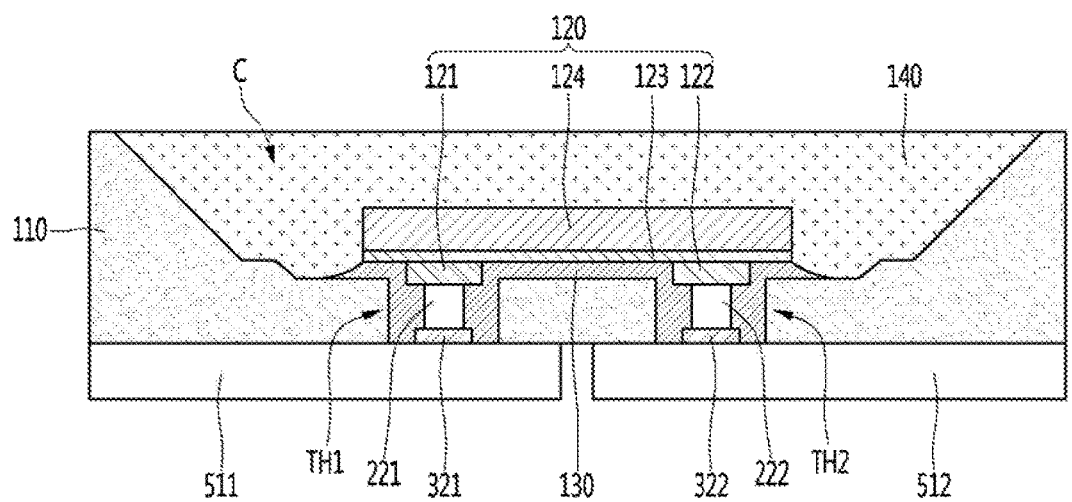
[FIG. 23]
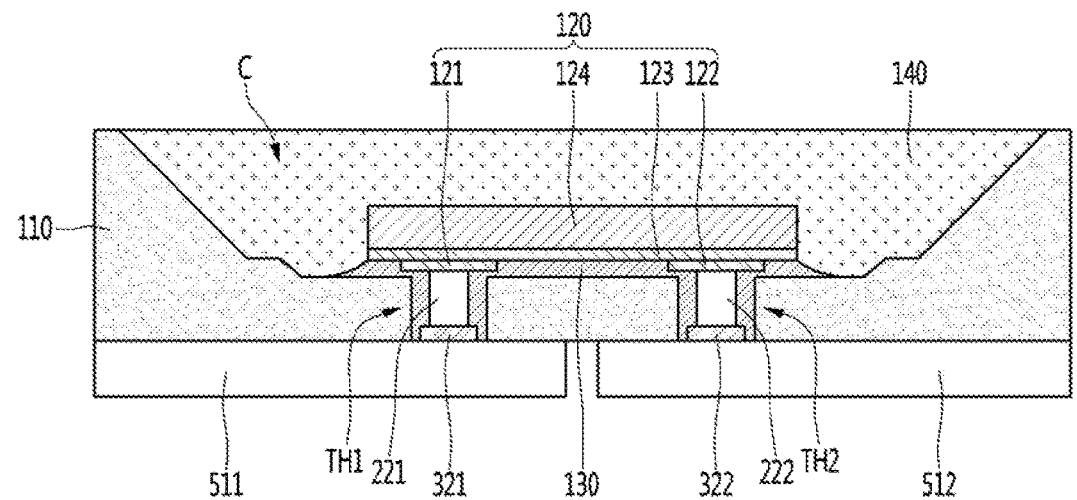

[FIG. 24]
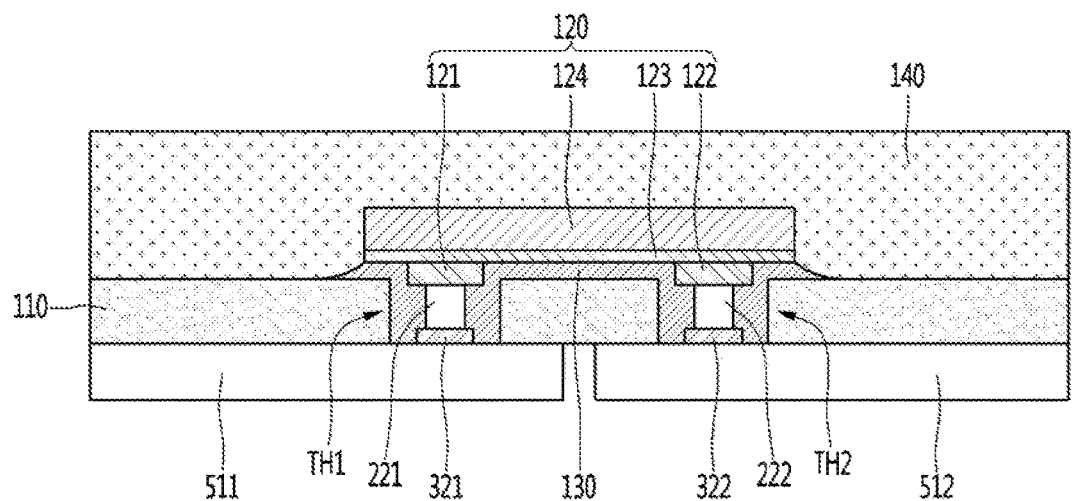
[FIG. 25]
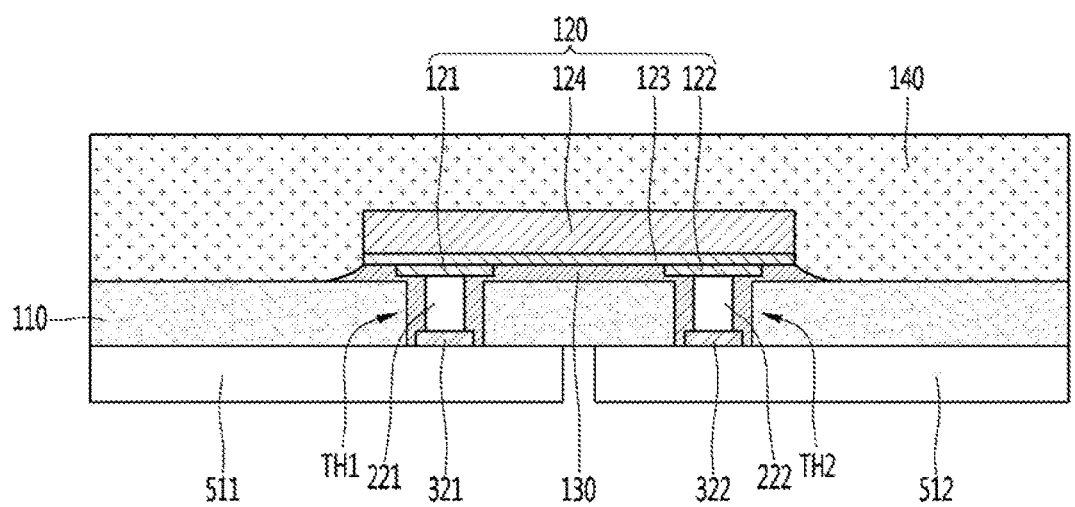

LIGHT EMITTING DEVICE PACKAGE

CROSS REFERENCE TO RELATED APPLICATIONS

This application is the National Phase of PCT International Application No. PCT/KR2018/015073, filed on Nov. 30, 2018, which claims priority under 35 U.S.C. 119(a) to Patent Application No. 10-2017-0164415, filed in the Republic of Korea on Dec. 1, 2017, all of which are hereby expressly incorporated by reference into the present application.

FIELD OF THE INVENTION

Embodiments relate to a semiconductor device package, a method of manufacturing a semiconductor device package, and a light source device.

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a semiconductor device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication means, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method of improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, research on a method of reducing the manufacturing cost and improving the manufacturing yield by improving the process efficiency and changing the structure in a semiconductor device package has been studied.

SUMMARY OF THE INVENTION

Embodiments can provide a semiconductor device package, a method of manufacturing a semiconductor device package, and a light source device, that are capable of improving light extraction efficiency and electrical characteristics.

Embodiments can provide a semiconductor device package, a method of manufacturing a semiconductor device package, and a light source device, that are capable of reducing manufacturing cost and improving manufacturing yield by improving process efficiency and providing new package structure.

Embodiments can provide a semiconductor device package and a method of manufacturing a semiconductor device package that are capable of preventing a re-melting phenomenon from occurring in a bonding region of a semiconductor device package in a process of re-bonding the semiconductor device package to a board or the like.

A light emitting device package according to an embodiment may comprise first and second frames spaced apart from each other and comprising first and second openings, respectively; a body disposed between the first and second frames; a light emitting device disposed on the body and comprising first and second bonding parts; first and second conductive parts disposed under the first and second bonding parts; and first and second conductors disposed in the first and second openings, respectively, wherein the first and second conductive parts may extend into the first and second openings from the first and second bonding parts, respectively, and wherein the first and second conductors may be disposed between the first and second conductive parts and the first and second frames, respectively.

According to an embodiment, the first and second conductive parts may comprise at least one material selected from a group including Ag, Au, and Cu.

According to an embodiment, an upper surface of the first and second conductive parts may comprise a flat surface.

According to an embodiment, a thickness of the first and second conductive parts may be provided several tens of micrometers to several hundreds of micrometers.

According to an embodiment, the first and second conductive parts and the first and second bonding parts may comprise different materials each other.

According to an embodiment, an area of upper surfaces of the first and second conductive parts may be provided larger than an area of lower surfaces of the first and second conductors.

According to an embodiment, a distance between the first conductive part and the first opening on an upper surface of the first frame may be provided several tens of micrometers.

According to an embodiment, the first conductor may be disposed in direct contact with the first bonding part and the first conductive part.

According to an embodiment, a width of the first bonding part parallel to a major axis direction of the light emitting device may be provided larger than a width of the first opening parallel to the major axis direction of the light emitting device.

According to an embodiment, the body may comprise a recess concaved toward a lower surface from an upper surface of the body, and it may comprise a first resin provided in the recess and disposed in direct contact with a lower surface of the light emitting device.

According to an embodiment, a width of the first conductive part may be provided smaller than a width of the first opening in an upper surface of the first frame, and a width of the second conductive part may be provide smaller than a width of the second opening in an upper surface of the second frame.

Advantageous Effects

According to the semiconductor device package and the method of manufacturing the semiconductor device package of the embodiments, there is an advantage that light extraction efficiency, electrical characteristics and reliability can be improved.

According to the semiconductor device package and the method of manufacturing the semiconductor device package of the embodiments, there is an advantage that manufacturing cost can be reduced and manufacturing yield can be improved by improving process efficiency and providing new package structure.

The semiconductor device package according to the embodiment has an advantage that the reflector can be prevented from being discolored by providing the body with high reflectance, thereby improving the reliability of the semiconductor device package.

According to the semiconductor device package and the method of manufacturing the semiconductor device of the embodiments, there is an advantage that re-melting phenomenon can be prevented from occurring in the bonding region of the semiconductor device package in the process of re-bonding the semiconductor device package to a board or the like.

BRIEF DESCRIPTION OF THE DRAWINGS

FIG. 1 is a plan view of a light emitting device package according to an embodiment of the present invention.

FIG. 2 is a bottom view of the light emitting device package shown in FIG. 1.

FIG. 3 is a cross-sectional view taken along line D-D of the light emitting device package shown in FIG. 1.

FIG. 4 is an enlarged cross-sectional view of an opening area of the light emitting device package shown in FIG. 1.

FIGS. 5 to 8 are views illustrating a method of manufacturing a light emitting device package according to an embodiment of the present invention.

FIG. 9 is a view showing another example of a light emitting device package according to an embodiment of the present invention.

FIG. 10 is a view showing another example of a light emitting device package according to an embodiment of the present invention.

FIG. 11 is a view showing another example of a light emitting device package according to an embodiment of the present invention.

FIG. 12 is an exploded perspective view illustrating the light emitting device package shown in FIG. 11.

FIG. 13 is a view showing another example of a light emitting device package according to an embodiment of the present invention.

FIG. 14 is a bottom view of the light emitting device package shown in FIG. 13.

FIG. 15 is a cross-sectional view taken along line B-B of the light emitting device package shown in FIG. 13.

FIG. 16 is an enlarged view of a region in which the light emitting device of FIG. 15 is disposed.

FIG. 17 is a cross-sectional view taken along line C-C of the light emitting device package shown in FIG. 13.

FIG. 18 is a view showing another example of a light emitting device package according to an embodiment of the present invention.

FIG. 19 is a cross-sectional view taken along line E-E of the light emitting device package shown in FIG. 18.

FIG. 20 is a view showing an example of a shape of frame applied to the light emitting device package shown in FIG. 18.

FIG. 21 is a view showing another example of a light emitting device package according to an embodiment of the present invention.

FIG. 22 is a view showing another example of a light emitting device package according to an embodiment of the present invention.

FIG. 23 is a view showing another example of a light emitting device package according to an embodiment of the present invention.

FIG. 24 is a view showing another example of a light emitting device package according to an embodiment of the present invention.

FIG. 25 is a view showing another example of a light emitting device package according to an embodiment of the present invention.

DETAILED DESCRIPTION

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package and a method of manufacturing a semiconductor device package according to an embodiment of the present invention will be described in detail with reference to the accompanying drawings. Hereinafter, a case where a light emitting device is applied as an example of a semiconductor device will be described.

First, a light emitting device package according to an embodiment of the present invention will be described with reference to FIGS. 1 to 4.

The light emitting device package 100 according to the embodiment may comprise a package body 110 and a light emitting device 120 as shown in FIGS. 1 to 4.

The package body 110 may comprise a first frame 111 and a second frame 112. The first frame 111 and the second frame 112 may be spaced apart from each other.

The package body 110 may comprise a body 113. The body 113 may be disposed between the first frame 111 and the second frame 112. According to an embodiment, the package body 110 may be provided in a structure with a cavity C, or may be provided in a flat structure without a cavity C.

For example, the body 113 may be formed of at least one selected from a group including polyphthalamide (PPA), polychloro tri phenyl (PCT), liquid crystal polymer (LCP), polyamide 9T (PA9T), silicone, epoxy molding compound (EMC), silicon molding compound (SMC), ceramics, photo sensitive glass (PSG), sapphire ($Al_2O_3$), and the like. In addition, the body 113 may comprise a high refractive index filler such as $TiO_2$ and $SiO_2$.

According to an embodiment, the light emitting device 120 may comprise a first bonding part 121, a second bonding part 122, a light emitting structure 123, and a substrate 124.

The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. Also, the second bonding part 122 may be electrically connected to the second conductivity type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed between the light emitting structure 123 and the first frame 111. The second bonding part 122 may be disposed between the light emitting structure 123 and the second frame 112.

Each of the first bonding part 121 and the second bonding part 122 may be provided as a single layer or a multilayer by using one or more materials selected from a group including Ti, Al, Sn, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, and Ni/$IrO_x$/Au/ITO, or an alloy thereof.

Meanwhile, as shown in FIGS. 1 to 4, the light emitting device package 100 according to the embodiment may comprise a first opening TH1 and a second opening TH2. The first frame 111 may comprise the first opening TH1. The second frame 112 may comprise the second opening TH2.

The first opening TH1 may be provided in the first frame 111. The first opening TH1 may be provided passing through the first frame 111. The first opening TH1 may be provided passing through the upper surface and the lower surface of the first frame 111 in a first direction.

The first opening TH1 may be disposed under the first bonding part 121 of the light emitting device 120. The first opening TH1 may be provided to overlap with the first bonding part 121 of the light emitting device 120. The first opening TH1 may be provided to overlap with the first bonding part 121 of the light emitting device 120 in a first direction toward the lower surface from the upper surface of the first frame 111. The first bonding part 121 may be disposed on the first opening TH1.

The second opening TH2 may be provided in the second frame 112. The second opening TH2 may be provided passing through the second frame 112. The second opening portion TH2 may be provided passing through the upper surface and the lower surface of the second frame 112 in a first direction.

The second opening TH2 may be disposed under the second bonding part 122 of the light emitting device 120. The second opening TH2 may be provided to overlap with the second bonding part 122 of the light emitting device 120. The second opening TH2 may be provided to overlap with the second bonding part 122 of the light emitting device 120 in a first direction toward the lower surface from the upper surface of the second frame 112. The second bonding part 122 may be disposed on the second opening TH2.

According to the embodiment, the width W1 of the upper region of the first opening TH1 may be provided less than or equal to the width of the first bonding part 121. In addition, the width of the upper region of the second opening TH2 may be provided less than or equal to the width of the second bonding part 122.

The area of the upper region of the first opening TH1 may be provided smaller than the area of the lower surface of the first bonding part 121. Also, the area of the upper region of the second opening TH2 may be provided smaller than the area of the lower surface of the second bonding part 122.

Meanwhile, the first and second frames 111 and 112 may comprise a support member and a metal layer surrounding the support member.

According to the embodiment, after an etching process or a punching process for the support member is completed to form the first and second openings TH1 and TH2, a plating process or the like for the support members constituting the first and second frames 111 and 112 may be performed so that the metal layer may be formed. Accordingly, the metal layer may be formed on the surfaces of the support members constituting the first and second frames 111 and 112.

For example, the first and second frames 111 and 112 may comprise a Cu layer as a support member, and further comprise at least one metal layer selected from a group including Ni, Ag, and the like on the surface of the support member.

In the process of forming openings in the first and second frames 111 and 112, a punching process or the like may be used as an example. In addition, an etching process may be used as an example in the process of forming openings in the first and second frames 111 and 112. Here, when the openings are formed through a punching process or an etching process, the diameter of the openings may be provided with tens of micrometers to hundreds of micrometers.

A width W3 between the first opening TH1 and the second opening TH2 on the lower surface regions of the first frame 111 and the second frame 112 may be provided with hundreds of micrometers. The width W3 between the first opening TH1 and the second opening TH2 on the lower surface regions of the first frame 111 and the second frame 112 may be provided, for example, in a range of 100 micrometers to 150 micrometers.

The width W3 between the first opening TH1 and the second opening TH2 on the lower surface regions of the first frame 111 and the second frame 112 may be selected to be provided to a predetermined distance or more so as to prevent electrical short circuit from occurring between the bonding parts when the light emitting device package 100 of an embodiment is mounted on a circuit board, a submount, and the like.

The light emitting device package 100 according to the embodiment may comprise a first resin 130.

The first resin 130 may be disposed between the body 113 and the light emitting device 120. The first resin 130 may be disposed between an upper surface of the body 113 and a lower surface of the light emitting device 120.

Further, the light emitting device package 100 according to the embodiment may comprise a recess R, as shown in FIGS. 1 to 3.

The recesses R may be provided in the body 113. The recess R may be provided between the first opening TH1 and the second opening TH2. The recess R may be provided to be recessed in a first direction toward a lower surface from an upper surface of the body 113. The recess R may be disposed under the light emitting device 120. The recess R may be provided to overlap with the light emitting device 120 in the first direction.

For example, the first resin 130 may be disposed in the recess R. The first resin 130 may be disposed between the light emitting device 120 and the body 113. The first resin 130 may be disposed between the first bonding part 121 and the second bonding part 122. For example, the first resin 130 may be disposed in contact with a side surface of the first bonding part 121 and a side surface of the second bonding part 122.

The first resin 130 may comprise an adhesive function. The first resin 130 may provide an adhesive force to neighboring components. The first resin 130 may be referred to as an adhesive.

The first resin 130 may provide a stable fixing force between the light emitting device 120 and the package body 110. The first resin 130 may provide a stable fixing force between the light emitting device 120 and the body 113. The first resin 130 may be disposed in direct contact with the upper surface of the body 113, for example. In addition, the first resin 130 may be disposed in direct contact with the lower surface of the light emitting device 120.

For example, the first resin 130 may comprise at least one of an epoxy-based material, a silicone-based material, a hybrid material including an epoxy-based material and a silicone-based material. Also, as an example, when the first resin 130 comprises a reflective function, the adhesive may comprise a white silicone.

The first resin 130 may provide a stable fixing force between the body 113 and the light emitting device 120, when the light is emitted to the lower surface of the light emitting device 120, and the first resin may provide a light diffusing function between the light emitting device 120 and the body 113. When the light is emitted from the light emitting device 120 to the lower surface of the light emitting device 120, the first resin 130 provides a light diffusion function to improve the light extraction efficiency of the light emitting device package 100. In addition, the first resin 130 may reflect light emitted from the light emitting device 120. When the first resin 130 comprises a reflection function, the first resin 130 may be formed of a material including $TiO_2$, $SiO_2$, and the like.

According to an embodiment, the recess R may comprise a first recess R31 and a second recess R32. When viewed from above the light emitting device package, the first and second recesses R31 and R32 disposed under the lower surface of the light emitting device 120 may be disposed to extend beyond the side surface of the light emitting device 120.

Meanwhile, after the first resin 130 is provided to the first and second recesses R31 and R32, and a void may be formed in the first and second recesses R31 and R32 in the process of attaching the light emitting device 120 thereon. If a kind of void exists under the light emitting device 120, a popping phenomenon of the void may occur during a subsequent heat treatment process or operation of the light emitting device 120, and thereby the light emitting device may be damaged or reliability may be deteriorated.

However, according to the embodiment, even when voids are formed in the first and second recesses R31 and R32 in the process of attaching the light emitting device 120, the voids can be easily moved outside the side surface of the light emitting device 120 to the outer region. Accordingly, it is possible to prevent the presence of voids under the lower surface of the light emitting device 120, thereby preventing the light emitting device from being damaged and improving the reliability of the light emitting device package.

In addition, the light emitting device package according to the embodiment has been described based on the case where the first and second recesses R31 and R32 are disposed separated and spaced apart from each other under the light emitting device 120. However, according to an embodiment, the first and second recesses R31 and R32 may be provided connected to each other under the light emitting device 120.

According to the embodiment, the depth T1 of the recess R may be provided smaller than the depth T2 of the first opening TH1 or the depth T2 of the second opening TH2.

The depth T1 of the recess R may be determined in consideration of the adhesive force of the first resin 130. In addition, the depth T1 of the recess R may be determined by considering the stable strength of the body and/or so as to prevent cracks in the light emitting device package 100 by the heat emitted from the light emitting device 120.

The recess R may provide an appropriate space in which a kind of under fill process may be performed under the light emitting device 120. Here, the under fill process may be a process of disposing the first resin 130 under the light emitting device 120 after mounting the light emitting device 120 on the package body 110, or the under fill process may be a process of disposing the first resin 130 in the recess and then disposing the light emitting device 120 in order to mount the light emitting device 120 through the first resin 130 in the process of mounting the light emitting device 120 on the package body 110. The depth T1 and the width W4 of the recess R can affect the forming position and fixing force of the first resin 130. The depth T1 and the width W4 of the recess R may be determined so that sufficient fixing force can be provided by the first resin 130 disposed between the body 113 and the light emitting device 120.

For example, the depth T1 of the recess R may be provided by several tens of micrometers. The depth T1 of the recess R may be provided in a range of 40 micrometers to 60 micrometers.

In addition, the width W4 of the recess R may be several tens of micrometers to several hundreds of micrometers. Here, the width W4 of the recess R may be provided in the major axis direction of the light emitting device 120.

The width W4 of the recess R may be provided narrower than the gap between the first bonding part 121 and the second bonding part 122. The width W4 of the recess R may be provided in a range of 140 micrometers to 160 micrometers. For example, the width W4 of the recess R may be provided at 150 micrometers.

The depth T2 of the first opening TH1 may be provided corresponding to the thickness of the first frame 111. The depth T2 of the first opening TH1 may be provided with a thickness capable of maintaining stable strength of the first frame 111.

For example, the depth T2 of the first opening TH1 may be provided several hundreds of micrometers. The depth T2 of the first opening TH1 may be provided with 180 micrometers to 220 micrometers. For example, the depth T2 of the first opening TH1 may be provided with 200 micrometers.

For example, the thickness of (T2−T1) may be selected to be at least 100 micrometers or more. This is in consideration of the thickness of the injection process capable of providing crack free of the body 113.

According to the embodiment, a ratio (T2/T1) of the T1 thickness and the T2 thickness may be provided in a range of 2 to 10. As an example, when the thickness of T2 is provided in 200 micrometers, the thickness of T1 may be provided in a range of 20 micrometers to 100 micrometers.

In addition, the light emitting device package 100 according to the embodiment may comprise a molding part 140, as shown in FIGS. 1 to 3.

The molding part 140 may comprise an insulating material. Also, the molding part 140 may comprise wavelength conversion means for receiving light emitted from the light emitting device 120 and providing wavelength-converted light. For example, the molding part 140 may comprise at least one selected from a group including phosphors, quantum dots, and the like.

The light emitting device package 100 according to the embodiment may comprise a first conductive part 221 and a second conductive part 222, as shown in FIGS. 1 to 4. In addition, the light emitting device package 100 according to the embodiment may comprise a first conductor 321 and a second conductor 322. The first conductor 321 may be spaced apart from the second conductor 322.

The first conductive part 221 may be disposed under the first bonding part 121. The first conductive part 221 may be electrically connected to the first bonding part 121. The first conductive part 221 may be disposed to overlap with the first bonding part 121 in the first direction.

The first conductive part 221 may be provided in the first opening TH1. The first conductive part 221 may be disposed between the first bonding part 121 and the first conductor 321. The first conductive part 221 may be electrically connected to the first bonding part 121 and the first conductor 321.

The lower surface of the first conductive part 221 may be disposed lower than the upper surface of the first opening TH1. The lower surface of the first conductive part 221 may be disposed lower than the upper surface of the first conductor 321.

The first conductive part 221 may be disposed on the first opening TH1. In addition, the first conductive part 221 may extend from the first bonding part 121 into the inside of the first opening TH1.

In addition, the second conductive part 222 may be disposed under the second bonding part 122. The second conductive part 222 may be electrically connected to the second bonding part 122. The second conductive part 222 may be disposed to overlap with the second bonding part 122 in the first direction.

The second conductive part 222 may be provided in the second opening TH2. The second conductive part 222 may be disposed between the second bonding part 122 and the second conductor 322. The second conductive part 222 may be electrically connected to the second bonding part 122 and the second conductor 322.

The lower surface of the second conductive part 222 may be disposed lower than the upper surface of the second opening TH2. The lower surface of the second conductive part 222 may be disposed lower than the upper surface of the second conductor 322.

The second conductive part 222 may be disposed on the second opening TH2. The second conductive part 222 may extend from the second bonding part 122 into the inside of the second opening TH2.

According to the embodiment, the first conductor 321 may be disposed on a lower surface and a side surface of the first conductive part 221. The first conductor 321 may be disposed in direct contact with the lower surface and the side surface of the first conductive part 221. The lower surface of the first conductor 321 may have a concave shape from the lower portion to the upper portion.

In addition, according to the embodiment, the second conductor 322 may be disposed on a lower surface and a side surface of the second conductive part 222. The second conductor 322 may be disposed in direct contact with the lower surface and the side surface of the second conductive part 222. The lower surface of the second conductor 322 may have a concave shape from the lower portion to the upper portion.

The first conductor 321 may be provided in the first opening TH1. The first conductor 321 may be disposed under the first bonding part 121. The width of the first conductor 321 may be provided smaller than the width of the first bonding part 121.

According to the light emitting device package of the embodiment, the electrical connection between the first conductor 321 and the first bonding part 121 can be more stably provided by the first conductive part 221.

The first bonding part 121 may have a width in a second direction perpendicular to the first direction in which the first opening TH1 is formed. The width of the first bonding part 121 may be provided greater than the width of the first opening TH1 in the second direction.

The first conductor 321 may be disposed in direct contact with the lower surface of the first bonding part 121. The first conductor 321 may be electrically connected to the first bonding part 121. The first conductor 321 may be surrounded by the first frame 111. The lower surface of the first conductor 321 may have a concave shape from the lower portion to the upper portion.

The second conductor 322 may be provided in the second opening TH2. The second conductor 322 may be disposed under the second bonding part 122. The width of the second conductor 322 may be provided smaller than the width of the second bonding part 122.

According to the light emitting device package 200 of the embodiment, the electrical connection between the second conductor 322 and the second bonding part 122 can be more stably provided by the second conductive part 222.

The second bonding part 122 may have a width in a second direction perpendicular to the first direction in which the second opening TH2 is formed. The width of the second bonding part 122 may be provided greater than the width of the second opening TH2 in the second direction.

The second conductor 322 may be disposed in direct contact with the lower surface of the second bonding part 122. The second conductor 322 may be electrically connected to the second bonding part 122. The second conductor 322 may be disposed so as to be surrounded by the second frame 112. The lower surface of the second conductor 322 may have a concave shape from the lower portion to the upper portion.

For example, the first and second conductors 221 and 222 may be stably bonded to the first and second bonding parts 121 and 122 through additional bonding materials, respectively. The side surfaces and the lower surfaces of the first and second conductors 221 and 222 may be in contact with the first and second conductive layers 321 and 322, respectively.

In addition, the first and second conductive parts 221 and 222 may be provided to the first and second bonding parts 121 and 122 through a plating process. For example, a seed layer may be provided on the first and second bonding parts 121 and 122 at a wafer level where a plurality of light emitting devices are formed, and after a mask layer such as a photoresist film is formed on the seed layer, then a plating process may be performed. After the plating process is performed, the first and second conductive parts 221 and 222 may be formed only in a predetermined region of the first and second bonding parts 121 and 122 through the removal of the photoresist film.

For example, the first and second conductive parts 221 and 222 may be formed of a single layer or a multilayer including at least one material selected from a group including Ag, Au, Cu, Ti, Ni, and the like. In addition, the first and second conductive parts 221 and 222 may comprise the seed layer. The seed layer may be formed of, for example, a single layer or a multilayer including at least one material selected from a group including Ti, Ni, Cu, and the like.

The first and second conductive parts 221 and 222 may be provided in a circular column shape or a polygonal column shape, for example. The shapes of the first and second conductive parts 221 and 222 may be selected corresponding to shapes of upper regions of the first and second openings TH1 and TH2. The width or diameter of the first and second conductive parts 221 and 222 may be provided smaller than the width or diameter of the upper regions of the first and second openings TH1 and TH2.

For example, the width or diameter of the first and second conductive parts 221 and 222 may be provided in a range of tens of micrometers to hundreds of micrometers. In addition, the thicknesses of the first and second conductive parts 221 and 222 may be provided in a range of tens of micrometers to hundreds of micrometers. As an example, the width or diameter of the first and second conductive parts 221 and 222 may be provided in a range of 130 micrometers to 170 micrometers, and the thickness of the first and second conductive parts 221 and 222 may be provided in a range of 60 micrometers to 100 micrometers.

Since the first and second conductive parts 221 and 222 must be inserted and disposed in the first and second openings TH1 and TH2, the widths and diameters of the first and second openings TH1 and TH2 may be provided to be tens of micrometers to hundreds of micrometers larger than the width or diameter of the first and second conductive parts 221 and 222, by considering process errors and the like.

As an example, the width or diameter of the first and second openings TH1 and TH1 may be provided in a range of 100 micrometers to 200 micrometers larger than the width or diameter of the first and second conductive parts 221 and 222. In addition, the width or diameter of the first and second openings TH1 and TH1 may be provided in a range of 1.5 to 2.5 times larger than the width or diameter of the first and second conductive parts 221 and 222.

The separation distance between the first conductive part 221 and the first opening TH1 on the upper surface of the first frame 111 providing the first opening TH1 may be provided in tens of micrometers. For example, a separation distance between the first conductive part 221 and the first opening TH1 on the upper surface of the first frame 111 may be provided in a range of 50 micrometers to 100 micrometers.

Upper surfaces of the first and second conductive parts 221 and 222 may comprise a flat surface. Side surfaces of the first and second conductive parts 221 and 222 may comprise an inclined surface. In addition, the first and second conductive parts 221 and 222 may have different areas in the upper region and the lower region. For example, an area of an upper region of the first and second conductive parts 221 and 222 may be provided larger than an area of the lower region.

The first and second conductive parts 221 and 222 and the first and second bonding parts 121 and 122 may be formed of different materials in separate processes. Accordingly, the first and second conductive parts 221 and 222 and the first and second bonding parts 121 and 122 may comprise different materials and different stacked structures.

According to an embodiment, compared to the case where the first and second conductors 321 and 322 are in direct contact with the lower surfaces of the first and second bonding parts 121 and 122, respectively, without providing the first and second conductive parts 221 and 222, an area in which the first and second conductors 321 and 322 are in contact with the first and second conductive parts 221 and 222, respectively, can be increased. Accordingly, power can be stably supplied to the first and second bonding parts 121 and 122 from the first and second conductors 321 and 322 through the first and second conductive parts 221 and 222, respectively.

In addition, in the light emitting device package 100 according to the embodiment, stresses due to thermal expansion and contraction are generated in the first and second bonding parts 121 and 122 and the first and second frames 111 and 112 by a long-time driving or repetitive heat treatment process. For example, stresses generated in the first and second bonding parts 121 and 122 and the first and second frames 111 and 112 may be generated parallel to the major axis direction of the light emitting device 120.

Meanwhile, in the light emitting device package 100 according to the embodiment, stresses generated in the first and second conductors 321 and 322 by a long-time driving or repetitive heat treatment process may be generated along a first direction in which the first and second openings TH1 and TH2 are formed.

Accordingly, in the upper regions of the first and second openings TH1 and TH2 in which the first and second bonding parts 121 and 122 and the first and second conductors 321 and 322 are adjacent, a kind of crack may be generated and propagated in the first and second conductors 321 and 322. When a kind of crack is formed in a boundary region between the first and second bonding parts 121 and 122 and the first and second conductors 321 and 322, an operating voltage may be increased and reliability of a light emitting device package may be deteriorated.

However, according to the embodiment, since the first and second conductive parts 221 and 222 are disposed, cracks may be prevented from being formed in upper regions of the first and second openings TH1 and TH2. In addition, even when cracks are formed, it is possible to prevent the cracks formed in the first and second conductors 321 and 322 from propagating along the lower surface regions of the first and second bonding parts 121 and 122 by the first and second conductive parts 221 and 222.

Therefore, according to the light emitting device package 100 of the embodiment, since cracks can be prevented from being formed and propagated in the first and second conductors 321 and 322 disposed in the upper regions of the first and second openings TH1 and TH2, high reliability can be secured.

The first conductor 321 and the second conductor 322 may comprise a material selected from a group including Ag, Au, Pt, Sn, Cu, and the like, or an alloy thereof. However, it is not limited thereto, and the first conductor 321 and the second conductor 322 may be formed of a material capable of ensuring a conductive function.

For example, the first conductor 321 and the second conductor 322 may be formed using a conductive paste. The conductive paste may comprise a solder paste, a silver paste, or the like, and may be composed of a multi-layer composed of different materials, or a multi-layer or a single layer composed of an alloy. For example, the first conductor 321 and the second conductor 322 may comprise a SAC (Sn—Ag—Cu) material.

According to the embodiment, in the process of forming the first and second conductive layers 321 and 322 or the post-heat treatment process in which the first and second conductive layers 321 and 322 are provided, an intermetallic compound (IMC) layer may be formed between the first and second conductive layers 321 and 322 and the first and second frames 111 and 112.

For example, an intermetallic compound layer may be formed by bonding between materials of the first and second conductors 321 and 322 and the first and second frames 111 and 112.

Accordingly, the first and second conductors 321 and 322 and the first and second frames 111 and 112 can be stably coupled physically and electrically, respectively.

For example, the intermetallic compound layer may comprise at least one metal layer selected from a group including AgSn, CuSn, AuSn, and the like. The intermetallic compound layer may be formed by a coupling of a first material and a second material, a first material may be provided from the first and second conductors 321 and 322, and a second material may be provided from the first and second frames 111 and 112.

According to an embodiment, the intermetallic compound layer may be provided with a thickness of several micrometers. As an example, the intermetallic compound layer may be formed to have a thickness in a range of 1 micrometer to 3 micrometers.

When the first and second conductors 321 and 322 comprise a Sn material and the first and second frames 111 and 112 comprise a Ag material, an intermetallic compound layer of AgSn may be formed by a coupling of the Sn material and the Ag material, in the process of providing the first and second conductors 321 and 322 or the post-heat treatment process in which the first and second conductors 321 and 322 are provided.

In addition, when the first and second conductors 321 and 322 comprise a Sn material and the first and second frames 111 and 112 comprise a Au material, an intermetallic compound layer of AuSn may be formed by a coupling of the Sn material and the Au material, in the process of providing the first and second conductors 321 and 322 or the post-heat treatment process in which the first and second conductors 321 and 322 are provided.

In addition, when the first and second conductors 321 and 322 comprise a Sn material and the first and second frames 111 and 112 comprise a Cu material, an intermetallic compound layer of CuSn may be formed by a coupling of the Sn material and the Cu material, in the process of providing the first and second conductors 321 and 322 or the post-heat treatment process in which the first and second conductors 321 and 322 are provided.

In addition, when the first and second conductors 321 and 322 comprise a Ag material and the first and second frames 111 and 112 comprise a Sn material, an intermetallic compound layer of AgSn may be formed by a coupling of the Ag material and the Sn material, in the process of providing the first and second conductors 321 and 322 or the post-heat treatment process in which the first and second conductors 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

Meanwhile, according to an embodiment, an intermetallic compound layer may also be formed between the first and second bonding parts 121 and 122 and the first and second conductors 321 and 322.

Similar to that described above, according to an embodiment, in the process of forming the first and second conductors 321 and 322 or in the heat treatment process after the first and second conductors 321 and 322 are provided, an intermetallic compound (IMC) layer may be formed between the first and second conductors 321 and 322 and the first and second bonding parts 121 and 122.

For example, an alloy layer may be formed by bonding between a material of the first and second conductors 321 and 322 and the first and second bonding parts 121 and 122.

Accordingly, the first conductor 321 and the first bonding part 121 can be physically and electrically coupled more stably. The first conductor 321, the alloy layer, and the first bonding part 121 may be physically and electrically coupled stably.

In addition, the second conductor 322 and the second bonding part 122 may be physically and electrically coupled more stably. The second conductor 322, the alloy layer, and the second bonding part 122 may be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, a first material may be provided from the first and second conductors 321 and 322, and a second material may be provided from the second bonding part 121 and 122.

According to an embodiment, the intermetallic compound layer may be provided with a thickness of several micrometers. For example, the intermetallic compound layer may be formed to have a thickness in a range of 1 micrometer to 3 micrometers.

When the first and second conductors 321 and 322 comprise a Sn material and the first and second bonding parts 121 and 122 comprise a Ag material, an intermetallic compound layer of AgSn may be formed by a coupling of Sn material and Ag material, in the process of providing the first and second conductors 321 and 322 or the post-heat treatment process in which the first and second conductors 321 and 322 are provided.

In addition, when the first and second conductors 321 and 322 comprise a Sn material and the first and second bonding parts 121 and 122 comprise a Au material, an intermetallic compound layer of AuSn may be formed by a coupling of Sn material and Au material, in the process of providing the first and second conductors 321 and 322 or the post-heat treatment process in which the first and second conductors 321 and 322 are provided.

In addition, when the first and second conductors 321 and 322 comprise a Ag material and the first and second bonding parts 121 and 122 comprise a Sn material, an intermetallic compound layer of AgSn may be formed by a coupling of Ag material and Sn material, in the process of providing the first and second conductors 321 and 322 or the post-heat treatment process in which the first and second conductors 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

Meanwhile, according to the embodiment, an intermetallic compound layer may also be formed between the first and second conductive parts 221 and 222 and the first and second conductor 321 and 322.

Similar to that described above, according to the embodiment, in the process of forming the first and second conductors 321 and 322, or the post-heat treatment process in which the first and second conductors 321 and 322 are provided, an intermetallic compound (IMC) layer may be formed between the first and second conductors 321 and 322 and the first and second conductive parts 221 and 222.

For example, an alloy layer may be formed by bonding between a material of the first and second conductors 321 and 322 and the first and second conductive parts 221 and 222.

Accordingly, the first conductor 321 and the first conductive part 221 can be physically and electrically coupled more stably. The first conductor 321, the alloy layer, and the first conductive part 221 can be physically and electrically coupled stably.

In addition, the second conductor 322 and the second conductive body 222 can be physically and electrically coupled more stably. The second conductor 322, the alloy layer, and the second conductive part 222 can be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, and the first material may be provided from the first and second conductive layers 321 and 322, and the second material may be provided from the first and second conductors 221 and 222.

According to the embodiment, the intermetallic compound layer may be provided with a thickness of several micrometers. For example, the intermetallic compound layer may be formed to have a thickness in a range of 1 micrometer to 3 micrometers.

When the first and second conductors 321 and 322 comprise a Sn material and the first and second conductive parts 221 and 222 comprise a Ag material, an intermetallic compound layer of AgSn may be formed by a coupling of the Sn material and the Ag material, in the process of providing the first and second conductors 321 and 322 or the post-heat treatment process in which the first and second conductors 321 and 322 are provided.

In addition, when the first and second conductors 321 and 322 comprise a Sn material and the first and second conductive parts 221 and 222 comprise a Au material, an intermetallic compound layer of AuSn may be formed by a coupling of the Sn material and the Au material, in the process of providing the first and second conductors 321 and 322 or the post-heat treatment process in which the first and second conductors 321 and 322 are provided.

In addition, when the first and second conductors 321 and 322 comprise a Ag material and the first and second conductive parts 221 and 222 comprise a Sn material, an intermetallic compound layer of AgSn may be formed by a coupling of the Ag material and the Sn material, in the process of providing the first and second conductors 321 and 322 or the post-heat treatment process in which the first and second conductors 321 and 322 are provided.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, as shown in FIGS. 1 to 3, the light emitting device package 100 according to the embodiment may comprise a first lower recess R11 and a second lower recess R12. The first lower recess R11 and the second lower recess R12 may be spaced apart from each other.

The first lower recess R11 may be provided on a lower surface of the first frame 111. The first lower recess R11 may be provided to be concaved from the lower surface toward the upper surface of the first frame 111. The first lower recess R11 may be spaced apart from the first opening TH1.

The first lower recess R11 may be provided with a width in a range of several micrometers to several tens of micrometers. A resin part may be provided in the first lower recess R11. The resin part filled in the first lower recess R11 may be provided with the same material as the body 113, for example.

However, it is not limited thereto, and the resin part may be selected from materials having poor adhesive force and wettability with the first and second conductors 321 and 322. Alternatively, the resin part may be selected and provided from materials having a low surface tension with respect to the first and second conductors 321 and 322.

For example, the resin part filled in the first lower recess R11 may be provided in the process of forming the first frame 111, the second frame 112, and the body 113 through an injection process or the like.

The resin part filled in the first lower recess R11 may be disposed around the lower surface region of the first frame 111 providing the first opening TH1. The lower surface area of the first frame 111 providing the first opening TH1 may be disposed as a kind of an island in a shape separated from an adjacent lower surface forming the first frame 111.

For example, as shown in FIG. 2, the lower surface area of the first frame 111 providing the first opening TH1 may be isolated from the adjacent first frame 111 by the resin part filled in the first lower recess R11 and the body 113.

Accordingly, when the resin part is disposed of a material having poor adhesion and wettability with the first and second conductors 321 and 322, or a material having a low surface tension between the resin part and the first and second conductors 321 and 322, it can be prevented that the first conductor 321 provided in the first opening TH1 is moved from the first opening TH1 and spreads beyond the resin part filled in the first lower recess R11 or the body 113.

This is because the adhesion between the first conductor 321, and the resin part and the body 113, or the wettability, surface tension and the like between the resin part and the first and second conductors 321 and 322 are not good. That is, the material forming the first conductor 321 may be selected to have good adhesive properties with the first frame 111. In addition, the material forming the first conductor 321 may be selected to have poor adhesive properties with the resin part and the body 113.

Therefore, it can be prevented that the first conductor 321 overflows or spreads out of the region where the resin part or body 113 is provided by overflowing from the first opening TH1 toward the region where the resin part or the body 113 is provided, and the first conductor 321 can be stably disposed in an area where the first opening TH1 is provided.

When the first conductor 321 disposed in the first opening TH1 overflows, the first conductor 321 may be prevented from expanding to the outer region of the first lower recess R11 provided with the resin part or the body 113. In addition, the first conductor 321 can be stably connected to the lower surface of the first bonding part 121 in the first opening TH1.

Therefore, when the light emitting device package is mounted on a circuit board, the first conductor 321 and the second conductor 322 can be prevented from being in contact with each other to be short-circuited, and the amount of the first and second conductors 321 and 322 can be very easily controlled in a disposing process of the first and second conductors 321 and 322.

In addition, the second lower recess R12 may be provided on a lower surface of the second frame 112. The second lower recess R12 may be provided to be concaved from the lower surface toward the upper surface of the second frame 112. The second lower recess R12 may be spaced apart from the second opening TH2.

The second lower recess R12 may be provided with a width in a range of several micrometers to tens of micrometers. A resin part may be provided in the second lower recess R12. The resin part filled in the second lower recess R12 may be provided with the same material as the body 113, for example.

However, it is not limited thereto, and the resin part may be selected from materials having poor adhesive force and wettability with the first and second conductors 321 and 322. Alternatively, the resin part may be selected and provided from materials having a low surface tension with respect to the first and second conductors 321 and 322.

For example, a resin part filled in the second lower recess R12 may be provided in the process of forming the first frame 111, the second frame 112, and the body 113 through an injection process or the like.

A resin part filled in the second lower recess R12 may be disposed around a lower surface region of the second frame 112 providing the second opening TH2. The lower surface area of the second frame 112 providing the second opening TH2 may be disposed as a kind of an island in a shape separated from an adjacent lower surface forming the second frame 112.

For example, as shown in FIG. 2, the lower surface area of the second frame 112 providing the second opening TH2 may be isolated from the adjacent second frame 112 by the resin part filled in the second lower recess R12 and the body 113.

Accordingly, when the resin part is disposed of a material having poor adhesion and wettability with the first and second conductors 321 and 322, or a material having a low surface tension between the resin part and the first and second conductors 321 and 322, it can be prevented that the second conductor 322 provided in the second opening TH2 is moved from the second opening TH2 and spreads beyond the resin part filled in the second lower recess R12 or the body 113.

This is because the adhesion between the second conductor 322, and the resin part and the body 113, or the wettability, surface tension and the like between the resin part and the first and second conductors 321 and 322 are not good. That is, the material forming the second conductor 322 may be selected to have good adhesive properties with the second frame 112. In addition, the material forming the second conductor 322 may be selected to have poor adhesive properties with the resin part and the body 113.

Therefore, it can be prevented that the second conductor 322 overflows or spreads out of the region where the resin part or body 113 is provided by overflowing from the second opening TH2 toward the region where the resin part or the body 113 is provided, and the second conductor 322 can be stably disposed in an area where the second opening TH2 is provided.

When the second conductor 322 disposed in the second opening TH2 overflows, the second conductor 322 may be prevented from expanding to the outer region of the second lower recess R12 provided with the resin part or the body 113. In addition, the second conductor 321 can be stably connected to the lower surface of the second bonding part 122 in the second opening TH2.

Therefore, when the light emitting device package is mounted on a circuit board, the first conductor 321 and the second conductor 322 can be prevented from being in contact with each other to be short-circuited, and the amount of the first and second conductors 321 and 322 can be very easily controlled in a disposing process of the first and second conductors 321 and 322.

Meanwhile, according to the light emitting device package 100 of the embodiment, as shown in FIG. 3, the first resin 130 provided on the recess R may be provided between the lower surface of the light emitting device 120 and the upper surfaces of the package body 110. The first resin 130 may be provided around the first and second bonding parts 121 and 122 when viewed from the above the light emitting device 120. In addition, the first resin 130 may be provided around the first and second openings TH1 and TH2 when viewed from above the light emitting device 120.

The first resin 130 may function to stably fix the light emitting device 120 to the package body 110. Also, the first resin 130 may be disposed around the first and second bonding parts 121 and 122 in contact with the side surfaces of the first and second bonding parts 121 and 122.

The first resin 130 may seal the periphery of the first and second bonding parts 121 and 122. The first resin 130 may prevent the first conductor 321 and the second conductor 322 from diffusing and moving outside the first opening TH1 region and the second opening TH2 region in the direction of the outer surface of the light emitting device 120. When the first and second conductors 321 and 322 diffuse and move in the direction of the outer surface of the light emitting device 120, the first and second conductors 321 and 322 may contact the active layer of the light emitting device 120, thereby causing defects due to short circuit. Accordingly, when the first resin 130 is disposed, short circuit caused by the first and second conductors 321 and 322 and the active layer can be prevented, thereby improving the reliability of the light emitting device package according to the embodiment.

In addition, the first resin 130 can prevent the first conductor 321 and the second conductor 322 from being diffused toward the recess R under the lower surface of the light emitting device 120 beyond the first opening TH1 region and the second opening TH2 region. Accordingly, it is possible to prevent the first conductor 321 and the second conductor 322 from being electrically shorted under the light emitting device 120.

Since the first resin 130 can seal around the first and second openings TH1 and TH2, it is possible to prevent foreign substances from flowing or moisture from entering into the periphery of the light emitting device 120 through the first and second openings TH1 and TH2 region.

Meanwhile, the first resin 130 may be disposed in upper regions of the first and second openings TH1 and TH2. In the process in which the light emitting device 120 is provided on the package body 110, a portion of the first resin 130 may be moved to the first and second openings TH1 and TH2 region. A portion of the first resin 130 may be disposed in lower regions of the first and second bonding parts 121 and 122. In addition, a portion of the first resin 130 may be disposed on the side surfaces of the first and second conductive parts 221 and 222.

The first resin 130 can seal around the upper regions of first and second openings TH1 and TH2, it is possible to prevent moisture or foreign substances from entering into the region where the light emitting device 120 is disposed through the first and second openings TH1 and TH2.

In addition, when a space in which the first resin 130 can be provided between the light emitting device 120 and the package body 110 is sufficiently secured, the recess R may not be provided on the upper surface of the package body 110.

In addition, according to an embodiment, the light emitting structure 123 may be provided as a compound semiconductor. The light emitting structure 123 may be provided as, for example, Group II-VI or Group III-V compound semiconductors. For example, the light emitting structure 123 may comprise at least two elements selected from aluminum (Al), gallium (Ga), indium (In), phosphorus (P), arsenic (As), and nitrogen (N).

The light emitting structure 123 may comprise a first conductivity type semiconductor layer, an active layer, and a second conductivity type semiconductor layer.

In the light emitting device package 100 according to the embodiment, power may be connected to the first bonding part 121 through the first opening TH1 region, and connected to the second bonding part 121 through the second opening TH2 region.

Accordingly, the light emitting device 120 can be driven by the driving power supplied through the first bonding part 121 and the second bonding part 122. The light emitted from the light emitting device 120 may be provided in an upward direction of the package body 110.

Meanwhile, the light emitting device package 100 according to the embodiment described above may be mounted on a submount, a circuit board, or the like and provided.

However, when the light emitting device package is mounted on the submount or the circuit board, a high temperature process such as a reflow process or the like may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package of the embodiment, the bonding part of the light emitting device according to the embodiment can receive the driving power through the conductive layer disposed in the opening. The melting point of the conductive layer disposed in the opening and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Then, referring to FIGS. 5 to 8, a method of manufacturing a light emitting device package according to an embodiment of the present invention will be described.

In describing a method of manufacturing a light emitting device package of an embodiment of the present invention with reference to FIGS. 5 to 8, descriptions overlapping with those described with reference to FIGS. 1 to 4 may be omitted.

First, according to a method of manufacturing a light emitting device package of an embodiment of the present invention, as shown in FIG. 5, a package body 110 may be provided.

The package body 110 may comprise a first frame 111 and a second frame 112. The first frame 111 and the second frame 112 may be spaced apart from each other.

Further, the first frame 111 may comprise a first opening TH1. The second frame 112 may comprise a second opening TH2.

Meanwhile, the first and second frames 111 and 112 may comprise a support member and a metal layer surrounding the support member.

According to the embodiment, after an etching process or a punching process for the support member is completed to form the first and second openings TH1 and TH2, a plating process or the like for the support members constituting the first and second frames 111 and 112 may be performed so that the metal layer may be formed. Accordingly, the metal layer may be formed on the surfaces of the support members constituting the first and second frames 111 and 112.

For example, the first and second frames 111 and 112 may comprise a Cu layer as a support member, and further comprise at least one metal layer selected from a group including Ni, Ag, and the like on the surface of the support member.

In addition, the package body 110 may comprise a recess R provided on the body 113.

In addition, the light emitting device package 100 according to the embodiment may comprise a first lower recess R11 and a second lower recess R12, as shown in FIG. 5. The first lower recess R11 and the second lower recess R12 may be spaced apart from each other.

As an example, the resin part filled in the first and second lower recesses R11 and R12 may be provided in the process of forming the first frame 111, the second frame 112, and the body 113 through an injection process or the like.

Next, according to a method of manufacturing a light emitting device package according to an embodiment, as shown in FIG. 6, the first resin 130 may be provided in the recess R.

The first resin 130 may be provided to the recess R region through a dotting method or the like. For example, the first resin 130 may be provided in a predetermined amount in the region where the recess R is formed, and may be provided to overflow the recess R.

In addition, according to a method of manufacturing a light emitting device package of an embodiment, as shown in FIG. 7, a light emitting device 120 may be provided on the package body 110.

According to an embodiment, in the process in which the light emitting device 120 is disposed on the package body 110, the recess R may be utilized to serve as an align key.

The light emitting device 120 may be fixed to the body 113 by the first resin 130. A portion of the first resin 130 provided in the recess R may be moved in the direction of the first bonding part 121 and the second bonding part 122 of the light emitting device 120 to be cured. The first resin 130 may seal the circumference of the first and second bonding parts 121 and 122.

Accordingly, the first resin 130 may be provided in a wide area between the lower surface of the light emitting device 120 and the upper surface of the body 113, and the fixing force between the light emitting device 120 and the body 113 can be improved.

In addition, a first conductive part 221 may be disposed in the first opening TH1. The first conductive part 221 may be disposed under the first bonding part 121. The second conductive part 222 may be disposed in the second opening TH2. The second conductive part 222 may be disposed under the second bonding part 122.

Next, according to a method of manufacturing a light emitting device package of an embodiment, as shown in FIG. 8, first and second conductors 321 and 322, and a molding part 140 may be formed.

In the light emitting device package 100 according to an embodiment, the first bonding part 121 and the first conductive part 221 may be exposed through the first opening TH1. In addition, the second bonding part 122 and the second conductive part 222 may be exposed through the second opening TH2.

According to an embodiment, the first conductor 321 may be formed in the first opening TH1. In addition, the second conductor 322 may be formed in the second opening TH2.

For example, the first conductor 321 and the second conductor 322 may be formed using a conductive paste. The first conductor 321 and the second conductor 322 may be formed through a solder paste, a silver paste, or the like. For example, the first conductor 321 and the second conductor 322 may comprise SAC (Sn—Ag—Cu) materials.

According to an embodiment, in the process in which the first and second conductors 321 and 322 are formed or in the heat treatment process after the first and second conductors 321 and 322 are provided, an intermetallic compound (IMC) layer may be formed between the first and second conductors 321 and 322, and the first and second frames 111 and 112.

For example, an intermetallic compound layer may be formed by bonding between materials of the first and second conductors 321 and 322 and the first and second frames 111 and 112.

Accordingly, the first and second conductors 321 and 322 and the first and second frames 111 and 112 can be stably coupled physically and electrically, respectively.

For example, the intermetallic compound layer may comprise at least one metal layer selected from a group including AgSn, CuSn, AuSn, and the like. The intermetallic compound layer may be formed by a coupling of a first material and a second material, a first material may be provided from the first and second conductors 321 and 322, and a second material may be provided from the first and second frames 111 and 112.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

Meanwhile, according to an embodiment, an intermetallic compound layer may also be formed between the first and second bonding parts 121 and 122 and the first and second conductors 321 and 322.

Similar to that described above, according to an embodiment, in the process of forming the first and second conductors 321 and 322 or in the heat treatment process after the first and second conductors 321 and 322 are provided, an intermetallic compound (IMC) layer may be formed between the first and second conductors 321 and 322 and the first and second bonding parts 121 and 122.

Meanwhile, according to an embodiment, an intermetallic compound layer may also be formed between the first and second conductive parts 221 and 222 and the first and second conductors 321 and 322.

Similar to that described above, according to the embodiment, in the process of forming the first and second conductors 321 and 322, or the post-heat treatment process in which the first and second conductors 321 and 322 are provided, an intermetallic compound (IMC) layer may be formed between the first and second conductors 321 and 322 and the first and second conductive parts 221 and 222.

The molding part 140 may be provided on the light emitting device 120. The molding part 140 may be disposed on the first frame 111 and the second frame 112. The molding part 140 may be disposed in the cavity C provided by the package body 110.

Meanwhile, according to an embodiment, the molding part 140 may be formed after the first and second conductors 321 and 322 are formed. In addition, according to another example of a method of manufacturing a light emitting device package of an embodiment, the molding part 140 may be formed first, and the first conductor 321 and the second conductor 322 may be formed later.

In the light emitting device package 100 according to an embodiment, power may be connected to the first bonding part 121 through the first opening TH1 region, and power may be connected to the second bonding part 122 through the second opening TH2 region.

Accordingly, the light emitting device 120 may be driven by driving power supplied through the first bonding part 121 and the second bonding part 122. In addition, light emitted from the light emitting device 120 may be provided in an upper direction of the package body 110.

Meanwhile, the light emitting device package 100 according to the embodiment described above may be mounted on a submount, a circuit board, or the like and provided.

However, when the light emitting device package is mounted on the submount or the circuit board, a high temperature process such as a reflow process or the like may be applied. Here, in the reflow process, a re-melting phenomenon occurs in a bonding area between the frame and the light emitting device provided in the light emitting device package to deteriorate the stability of the electrical connection and the physical coupling, thereby an optical, electrical characteristics and reliability of the light emitting device package may be deteriorated.

However, according to the light emitting device package and the method of manufacturing the light emitting device package of the embodiment, the bonding part of the light emitting device according to the embodiment can receive the driving power through the conductive layer disposed in the opening. The melting point of the conductive layer disposed in the opening and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Next, another example of a light emitting device package according to an embodiment will be described with reference to FIG. 9.

FIG. 9 is a view showing another example of a light emitting device package according to an embodiment of the present invention. In describing a light emitting device package according to an embodiment with reference to FIG. 9, descriptions overlapping with those described with reference to FIGS. 1 to 8 may be omitted.

The light emitting device package according to the embodiment may comprise a resin layer 115 disposed in the first and second openings TH1 and TH2, as shown in FIG. 9. The resin layer 115 may be disposed under the first and second conductors 321 and 322.

The resin layer 115 may protect the first and second conductors 321 and 322. The resin layer 115 may seal the first and second openings TH1 and TH2. The resin layer 115 may prevent the first and second conductors 321 and 322 from diffusing and moving under the first and second openings TH1 and TH2.

In addition, the resin layer 115 may prevent foreign substances from flowing or moisture from entering into the periphery of the light emitting device 120 from outside through the first and second openings TH1 and TH2 region.

For example, the resin layer 115 may comprise a material similar to the body 113. The resin layer 115 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

In addition, the resin layer 115 may comprise at least one of an epoxy-based material, a silicone-based material, and a hybrid material including an epoxy-based material and a silicone-based material.

Next, another example of a light emitting device package according to an embodiment will be described with reference to FIG. 10.

Meanwhile, the light emitting device package according to the embodiment of the present invention shown in FIG. 10 shows another example in which the light emitting device package described with reference to FIGS. 1 to 9 is mounted on a circuit board 410 and supplied.

In describing a light emitting device package according to an embodiment of the present invention with reference to FIG. 10, descriptions overlapping with those described with reference to FIGS. 1 to 9 may be omitted.

The light emitting device package according to the embodiment may comprise a circuit board 410, a package body 110, and a light emitting device 120, as shown in FIG. 10.

The circuit board 410 may comprise a first pad 411, a second pad 412, and a board 413. The board 413 may be provided with a power supply circuit controlling the driving of the light emitting device 120.

The package body 110 may be disposed on the circuit board 410. The first pad 411 and the first bonding part 121 may be electrically connected to each other. The second pad 412 and the second bonding part 122 may be electrically connected to each other.

The first pad 411 and the second pad 412 may comprise a conductive material. For example, the first pad 411 and the second pad 412 may comprise at least one material selected from a group including Ti, Cu, Ni, Au, Cr, Ta, Pt, Sn, Ag, P, Fe, Sn, Zn, and Al or an alloy thereof. The first pad 411 and the second pad 412 may be provided as a single layer or a multilayer.

According to the embodiment, the first pad 411 of the circuit board 410 and the first conductor 321 may be electrically connected. Also, the second pad 412 of the circuit board 410 and the second conductor 322 may be electrically connected.

The first pad 411 may be electrically connected to the first frame 111. Also, the second pad 412 may be electrically connected to the second frame 112.

For example, the first conductor 321 and the second conductor 322 may be formed using a conductive paste. The conductive paste may comprise a solder paste, a silver paste, or the like, and may be composed of a multi-layer of different materials, or a multi-layer or a single layer composed of an alloy. For example, the first conductor 321 and the second conductor 322 may comprise a SAC (Sn—Ag—Cu) material.

According to the embodiment, in the process of forming the first and second conductors 321 and 322 or the post-heat treatment process in which the first and second conductors 321 and 322 are provided, an intermetallic compound (IMC) layer may be formed between the first and second conductors 321 and 322 and the first and second frames 111 and 112.

For example, an intermetallic compound layer may be formed by bonding between materials of the first and second conductors 321 and 322, and the first and second frames 111 and 112.

Accordingly, the first and second conductors 321 and 322 and the first and second frames 111 and 112 can be stably coupled physically and electrically, respectively.

Meanwhile, according to an embodiment, an intermetallic compound layer may also be formed between the first and second bonding parts 121 and 122 and the first and second conductors 321 and 322.

Similar to that described above, according to an embodiment, in the process of forming the first and second conductors 321 and 322 or in the heat treatment process after the first and second conductors 321 and 322 are provided, an intermetallic compound (IMC) layer may be formed between the first and second conductors 321 and 322, and the first and second bonding parts 121 and 122.

Meanwhile, according to an embodiment, an intermetallic compound layer may also be formed between the first and second conductive parts 221 and 222 and the first and second conductors 321 and 322.

Similar to that described above, according to an embodiment, in the process of forming the first and second conductors 321 and 322 or in the heat treatment process after the first and second conductors 321 and 322 are provided, an intermetallic compound (IMC) layer may be formed between the first and second conductors 321 and 322, and the first and second conductive parts 221 and 222.

Meanwhile, according to an embodiment, an additional bonding layer may be provided between the first pad 411 and the first frame 111. In addition, an additional bonding layer may be provided between the second pad 412 and the second frame 112.

According to an embodiment, similar to that described above, in the process where the package body 110 is mounted on the board 410, a material constituting the first pad 411 or a bonding material provided on the first pad 411 may be prevented from being diffused and moved toward the first opening TH1 by the resin part provided in the first lower recess R11.

In addition, according to an embodiment, in the process where the package body 110 is mounted on the board 410, a material constituting the second pad 412 or a bonding material provided on the second pad 412 may be prevented from being diffused and moved toward the second opening TH2 by the resin part provided in the second lower recess R12.

In the light emitting device package according to the embodiment described with reference to FIG. 10, the power supplied from the circuit board 410 may be transmitted to the first bonding part 121 and the second bonding part 122 through the first conductor 321 and the second conductor 322, respectively. Here, the first pad 411 of the circuit board 410 and the first frame 111 may be in direct contact with each other, and the second pad 412 of the circuit board 410 and the second frame 112 may be in direct contact with each other.

As described above, according to the light emitting device package and the method of manufacturing the light emitting device package of the embodiment, the bonding part of the light emitting device according to the embodiment can receive the driving power through the conductive layer disposed in the opening. Also, the melting point of the conductive layer disposed in the opening and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Next, another example of a light emitting device package according to an embodiment will be described with reference to FIGS. 11 and 12.

In describing the light emitting device package according to the embodiment with reference to FIGS. 11 and 12, descriptions overlapping with those described with reference to FIGS. 1 to 10 may be omitted.

The light emitting device package 200 according to the embodiment may comprise a package body 110 and a light emitting device 120 as shown in FIGS. 11 and 12.

The package body 110 may comprise a first frame 111 and a reflector 117. The reflector 117 may reflect light emitted from the light emitting device 120 in an upward direction. The reflector 117 may be disposed to be inclined with respect to the upper surface of the first frame 111.

The package body 110 may comprise the cavity C. The cavity may comprise a bottom surface and a side surface inclined from the bottom surface to the upper surface of the package body 110.

According to an embodiment, the light emitting device 120 may comprise a first bonding part 121, a second bonding part 122, a light emitting structure 123, and a substrate 124.

The light emitting device 120 may be disposed on the package body 110. The light emitting device 120 may be disposed on the first frame 111. The light emitting device 120 may be disposed in the cavity C provided by the reflector 117.

The first bonding part 121 may be disposed between the light emitting structure 123 and the first frame 111. The second bonding part 122 may be disposed between the light emitting structure 123 and the first frame 111.

Meanwhile, as shown in FIGS. 11 and 12, the light emitting device package 100 according to the embodiment may comprise a first opening TH1 and a second opening TH2.

The package body 110 may comprise the first opening TH1 passing through the lower surface of the package body 110 from the bottom surface of the cavity C. The package body 110 may comprise the second opening TH2 passing through the lower surface of the package body 110 from the bottom surface of the cavity C.

The first opening TH1 may be disposed under the first bonding part 121 of the light emitting device 120. The second opening TH2 may be disposed under the second bonding part 122 of the light emitting device 120. The light emitting device package 200 according to the embodiment may comprise a recess R, as shown in FIGS. 11 and 12. The recess R may be provided concavely from the bottom surface of the cavity C to the lower surface of the package body 110.

In addition, the inclined surfaces of the first and second openings TH1 and TH2 disposed between the first and second bonding parts 121 and 122 may be vertically overlapped with the recess R.

The recess R may be provided in the first frame 111. The recess R may be provided between the first opening TH1 and the second opening TH2. The recess R may be provided concave toward the lower surface from the upper surface of the first frame 111. The recess R may be disposed under the light emitting device 120.

The light emitting device package 200 according to the embodiment may comprise a first resin 130 as shown in FIG. 11.

The first resin 130 may be disposed on the recess R. The first resin 130 may be disposed between the light emitting device 120 and the first frame 111. The first resin 130 may be disposed between the first bonding part 121 and the second bonding part 122. For example, the first resin 130 may be disposed in contact with a side surface of the first bonding part 121 and a side surface of the second bonding part 122.

In addition, the light emitting device package 200 according to the embodiment may comprise a molding part 140, as shown in FIG. 11.

The molding part 140 may be provided on the light emitting device 120. The molding part 140 may be disposed on the first frame 111. The molding part 140 may be disposed in the cavity C provided by the reflector 117.

The light emitting device package 200 according to the embodiment may comprise a first conductive part 221 and a second conductive part 222 as shown in FIG. 11. In addition, the light emitting device package 200 according to the embodiment may comprise a first conductor 321 and a second conductor 322. The first conductor 321 may be disposed spaced apart from the second conductor 322.

As described above, according to the light emitting device package of the embodiment, electrical coupling between the first conductor 321 and the first bonding part 121 may be more stably provided by the first conductive part 221.

For example, the first and second conductive parts 221 and 222 may be stably bonded to the first and second bonding parts 121 and 122 through separate bonding materials, respectively. Further, side surfaces and lower surfaces of the first and second conductive parts 221 and 222 may contact the first and second conductors 321 and 322, respectively.

In addition, the first and second conductive parts 221 and 222 may be provided to the first and second bonding parts 121 and 122 through a plating process. For example, a seed layer may be provided on the first and second bonding parts 121 and 122 at a wafer level where a plurality of light emitting devices are formed, and after a mask layer such as a photoresist film is formed on the seed layer, then a plating process may be performed. After the plating process is performed, the first and second conductive parts 221 and 222 may be formed only in a predetermined region of the first and second bonding parts 121 and 122 through the removal of the photoresist film.

For example, the first conductor 321 and the second conductor 322 may be formed using a conductive paste. The conductive paste may comprise a solder paste, a silver paste, or the like, and may be composed of a multi-layer composed of different materials, or a multi-layer or a single layer composed of an alloy. For example, the first conductor 321 and the second conductor 322 may comprise a SAC (Sn—Ag—Cu) material.

Meanwhile, according to an embodiment, an intermetallic compound (IMC) layer may be formed between the first and second bonding parts 121 and 122 and the first and second conductors 321 and 322.

In the process of forming the first and second conductors 321 and 322 or in the heat treatment process after the first and second conductors 321 and 322 are provided, an intermetallic compound (IMC) layer may be formed between the first and second conductors 321 and 322 and the first and second bonding parts 121 and 122.

Accordingly, the first conductor 321 and the first bonding part 121 can be physically and electrically coupled more stably. The first conductor 321, the alloy layer, and the first bonding part 121 may be physically and electrically coupled stably.

In addition, the second conductor 322 and the second bonding part 122 may be physically and electrically coupled more stably. The second conductor 322, the alloy layer, and the second bonding part 122 may be physically and electrically coupled stably.

For example, the alloy layer may comprise at least one intermetallic compound layer selected from a group including AgSn, CuSn, AuSn, and the like. The intermetallic compound layer may be formed by a coupling of a first material and a second material, a first material may be provided from the first and second conductors 321 and 322, and a second material may be provided from the second bonding part 121 and 122.

The intermetallic compound layer described above can have a higher melting point than a common bonding material. In addition, the heat treatment process in which the intermetallic compound layer is formed can be performed at a lower temperature than the melting point of a common bonding material.

Therefore, even when the light emitting device package 100 according to the embodiment is bonded to a main board or the like through a reflow process, re-melting phenomenon does not occur, so there are advantages that electrical connection and physical bonding force are not deteriorated.

Meanwhile, according to an embodiment, an intermetallic compound layer may also be formed between the first and second conductive parts 221 and 222 and the first and second conductor 321 and 322.

Similar to that described above, according to the embodiment, in the process of forming the first and second conductors 321 and 322, or in the post-heat treatment process in which the first and second conductors 321 and 322 are provided, an intermetallic compound (IMC) layer may be formed between the first and second conductors 321 and 322 and the first and second conductive parts 221 and 222.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the package body 110 can be widened. According to the embodiment, the package body 110 may be provided using not only expensive materials such as ceramics but also relatively inexpensive resin materials.

For example, the package body 110 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Next, another example of a light emitting device package according to an embodiment will be described with reference to FIGS. 13 to 17.

In describing the light emitting device package according to the embodiment with reference to FIGS. 13 to 17, descriptions overlapping with those described with reference to FIGS. 1 to 12 may be omitted.

The light emitting device package 300 according to the embodiment may comprise a package body 110 and a light emitting device 120 as shown in FIGS. 13 to 17.

The package body 110 may comprise a plurality of frames, for example, a first frame 111 and a second frame 112.

The package body 110 may comprise a body 113. The body 113 may be disposed between the first frame 111 and the second frame 112. A first extension 111A of the first frame 111 may extend and protrude toward a first side direction of the package body 110. A second extension 112A of the second frame 112 may extend and protrude toward a second side direction of the package body 110. The first and second side surfaces of the package body 110 may be opposite to each other.

In addition, in the light emitting device package 300 according to the embodiment, power may be connected to the first bonding part 121 through a region of a first protrusion P1, and power may be connected to the second bonding part through region of a second protrusion P2. The first and second bonding parts 121 and 122 may be electrodes or pads. The light emitting device 120 may be disposed on the package body 110. The light emitting device 120 may be disposed on the first frame 111 and the second frame 112. Meanwhile, the light emitting device package 300 according to the embodiment may comprise a first protrusion P1 and a second protrusion P2, as shown in FIGS. 13 to 17. The first frame 111 may comprise a first protrusion P1. The second frame 112 may comprise a second protrusion P2.

The lower portion of the region corresponding to the first protrusion P1 may comprise the first recess P10. The protrusion height d of the first protrusion P1 may be equal to the depth e of the first recess P10.

The first protrusion P1 may have a greater length b1 in a second direction, which is the minor axis direction of the light emitting device 120, than a width b in a first direction, which is the major axis direction of the light emitting device 120. The first direction may be a horizontal direction, or a long side direction of the package body 110, or a direction in which the first and second frames 111 and 112 are spaced apart. The second direction may be a vertical direction, or a short side direction of the package body 110, or a direction in which the body 113 between the first and second frames 111 and 112 is extended. The second protrusion P2 may have a greater length b1 in the second direction than a width b in the first direction.

The first conductor 321 may be disposed between the first frame 111 and the first bonding part 121 of the light emitting device 120. The second conductor 322 may be disposed between the second frame 112 and the second bonding part 122 of the light emitting device 120. The first conductor 321 may be provided between the first protrusion P1 of the first frame 111 and the first bonding part 121. The second conductor 322 may be provided between the second protrusion P2 of the second frame and the second bonding part 122.

The first and second conductors 321 and 322 may be bonded to the first and second bonding parts 321 and 322 in upper regions of the first and second protrusions P1 and P2, and a portion of the first and second conductors 321 and 322 may be disposed around the lower portions of the first and second protrusions P1 and P2.

The light emitting device package 300 according to the embodiment may comprise a first conductive part 221 and a second conductive part 222.

The first conductive part 221 may be provided on the first protrusion P1. The first conductive part 221 may be disposed between the first bonding part 121 and the first protrusion P1. The second conductive part 222 may be provided on the second protrusion P2. The second conductive part 222 may be disposed between the second bonding part 122 and the second protrusion P2. The first conductor 321 may be disposed on a side surface of the first conductive part 221. The second conductor 322 may be disposed on a side surface of the second conductive part 222.

The first conductor 321 and the second conductor 322 may comprise a material selected from a group including Ag, Au, Pt, Sn, Cu, and the like, or an alloy thereof. However, it is not limited thereto, and the first conductor 321 and the second conductor 322 may be formed of a material capable of ensuring a conductive function.

For example, the first conductor 321 and the second conductor 322 may be formed using a conductive paste. The conductive paste may comprise a solder paste, a silver paste, or the like, and may be composed of a multi-layer composed of different materials, or a multi-layer or a single layer composed of an alloy. For example, the first conductor 321 and the second conductor 322 may comprise a SAC (Sn—Ag—Cu) material.

According to the embodiment, in the process of forming the first and second conductive layers 321 and 322 or the post-heat treatment process in which the first and second conductive layers 321 and 322 are provided, an intermetallic compound (IMC) layer may be formed between the first and second conductive layers 321 and 322 and the first and second frames 111 and 112.

For example, an intermetallic compound layer may be formed by bonding between materials of the first and second conductors 321 and 322 and the first and second frames 111 and 112.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC).

Meanwhile, according to an embodiment, an intermetallic compound layer may also be formed between the first and second bonding parts 121 and 122 and the first and second conductors 321 and 322.

Similar to that described above, according to an embodiment, in the process of forming the first and second conductors 321 and 322 or in the heat treatment process after the first and second conductors 321 and 322 are provided, an intermetallic compound (IMC) layer may be formed between the first and second conductors 321 and 322 and the first and second bonding parts 121 and 122.

Meanwhile, according to the embodiment, an intermetallic compound layer may also be formed between the first and second conductive parts 221 and 222 and the first and second conductor 321 and 322.

Therefore, even when the light emitting device package 100 according to the embodiment is bonded to a main board or the like through a reflow process, re-melting phenomenon does not occur, so there are advantages that electrical connection and physical bonding force are not deteriorated.

Meanwhile, according to the light emitting device package of the embodiment described above, the first and second conductors 321 and 322 may be provided between the first and second frames 111 and 112 and the first and second conductive parts 221 and 222. For example, in the regions of the first and second protrusions P1 and P2, the first and second conductors 321 and 322 may be provided between the first and second frames 111 and 112 and the first and second conductive parts 221 and 222.

The light emitting device package 100 according to the embodiment may comprise a first resin 130. The first resin 130 may be disposed between the body 113 and the light emitting device 120. For example, the first resin 130 may be in contact with the side surface of the first bonding part 121 and the side surface of the second bonding part 122, and may be correspond to inner portions of or in contact with the first protrusion P1 and the second protrusion P2. The thickness of the first resin 130 may be greater than the height d or thickness of the first and second protrusions P1 and P2, so that the first resin 130 may contact the light emitting device 120.

The second resin 135 may be disposed between the first frame 111 and the lower portion of the light emitting device 120. The second resin 135 may be disposed between the second frame 112 and the lower portion of the light emitting device 120. The thickness of the second resin 135 may be greater than the height d or thickness of the first and second protrusions P1 and P2, so that the second resin 135 may contact the light emitting device 120.

According to an embodiment, as shown in FIG. 16, the width b in the upper region of the first protrusion P1 in the first direction that is the long axis direction of the light emitting device 120 may be provided to be smaller than or equal to the width S2 of the first bonding part 121. The width of the upper region of the second protrusion P2 in the first direction may be provided to be smaller than or equal to the width of the second bonding part 122. The width S2 of the first bonding part 121 may be 20% or more compared to the width of the first direction, which is a long axis direction of the light emitting device 120, and may be, for example, in a range of 20% to 40%.

As shown in FIG. 17, the length b1 of the upper region of the first protrusion P1 in the second direction, which is the shortening direction of the light emitting device 120, may be smaller than the length S3 of the first bonding part 121. The length S3 of the first bonding part 121 may be 70% or more compared to the length of the second direction of the light emitting device 120 and may be, for example, in a range of 70% to 95%.

The width b and the length b1 of the upper region of the first protrusion P1 may be smaller than the width and length of the lower region of the first protrusion P1. The width and length of the upper region of the second protrusion P2 may be smaller than the width and length of the lower region of the second protrusion P2. When the width and length of the upper regions of the first and second protrusions P1 and P2 are greater than the width and length of the lower regions of the first and second protrusions P1 and P2, the strength of the protruding portion may be lowered, or the thickness of the protruding inclined portion may be thinned, or it can be difficult to form.

In the embodiment, when forming the first and second protrusions P1 and P2 on the first and second frames 111 and 112, the problem can be solved by preventing the first and second frames 111 and 112 from being curled or rolled by the first and second protrusions P1 and P2, and flat areas of the first and second bonding parts 121 and 122, and the first and second protrusions P1 and P2 may be provided in a range in which thermal conductivity and electrical conductivity are not deteriorated.

In addition, it is possible to simplify the process without performing a separate half-etching process on the upper portions of the first and second frames 111 and 112 and to provide a protrusion with a frame mold, thereby lowering the unit price of the frame and the price of the package.

Next, another example of a light emitting device package according to an embodiment will be described with reference to FIGS. 18 to 20.

In describing the light emitting device package according to the embodiment with reference to FIGS. 18 to 20, descriptions overlapping with those described with reference to FIGS. 1 to 17 may be omitted.

The light emitting device package according to the embodiment may comprise a package body 110 and a light emitting device 120 as shown in FIGS. 18 to 20.

The package body 110 may comprise a body 113. The body 113 may be disposed between the first frame 111 and the second frame 112.

For example, the first and second frames 111 and 112 may be provided in a shape as shown in FIG. 20. According to an embodiment, the first and second frames 111 and 112 may comprise a plurality of frames having a finger shape.

For example, the first frame 111 may comprise a 1a frame 111a, a 1b frame 111b, and a 1c frame 111c, and the second frame 112 may comprise a 2a frame 112a, a 2b frame 112b, and a 2c frame 112c. According to the light emitting device package of the embodiment, the 1b frame 111b and the 2b frame 112b may be exposed on the bottom surface of the cavity C.

According to an embodiment, the light emitting device 120 may comprise a first bonding part 121, a second bonding part 122, a light emitting structure 123, and a substrate 124.

The first bonding part 121 may be disposed on the 1b frame 111b. The second bonding part 122 may be disposed on the 2b frame 112b.

The light emitting device package according to the embodiment may comprise a first conductive part 221 and a second conductive part 222. The first conductive part 221 may be provided between the first bonding part 121 and the first frame 111. The second conductive part 222 may be provided between the second bonding part 122 and the second frame 112. Also, the light emitting device package according to the embodiment may comprise a first conductor 321 and a second conductor 322.

For example, the first conductor 321 and the second conductor 322 may be formed using a conductive paste. The conductive paste may comprise a solder paste, a silver paste, or the like, and may be composed of a multilayer composed of different materials, or a single layer or a multi-layer composed of alloy. For example, the first conductor 321 and the second conductor 322 may comprise SAC (Sn—Ag—Cu) materials.

Meanwhile, according to the light emitting device package of the embodiment, the first and second conductors 321 and 322 may be provided between the first and second conductive parts 221 and 222 and the first and second frames 111 and 112.

The light emitting device package according to the embodiment may comprise a first resin 130.

The first resin 130 may be disposed between the body 113 and the light emitting device 120. The first resin 130 may be disposed between the upper surface of the body 113 and the lower surface of the light emitting device 120.

In addition, the light emitting device package according to the embodiment may comprise a recess R.

The recess R may be provided on the body 113. According to an embodiment, the recess R may comprise a first recess R31 and a second recess R32. When viewed from above the light emitting device package, the first and second recess R31 and R32 disposed under the lower surface of the light emitting device 120 may be disposed to extend beyond the side surface of the light emitting device 120.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed in the cavity C provided by the package body 110.

Meanwhile, the light emitting device package according to the embodiment described above may be mounted on a sub-mount or a circuit board or the like and provided.

However, when the light emitting device package is mounted on the submount or the circuit board, a high temperature process such as a reflow process or the like may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package of the embodiment, the bonding part of the light emitting device according to the embodiment can receive the driving power through the conductive layer disposed on the frame. The melting point of the conductive layer disposed on the frame and the melting point of the intermetallic compound layer may be selected to have a higher value than the melting point of the common bonding material.

Therefore, even when the light emitting device package 100 according to the embodiment is bonded to a main board through a reflow process, re-melting phenomenon does not occur, so there are advantages that electrical connection and physical bonding force are not deteriorated.

In addition, according to the light emitting device package and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the body 113 can be widened. According to the embodiment, the body 113 may be provided using not only expensive materials such as ceramics but also relatively inexpensive resin materials.

For example, the body 113 may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Meanwhile, the light emitting device package described above may be provided with a flip chip light emitting device as an example.

For example, the flip chip light emitting device may be provided as a transmissive flip chip light emitting device that emits light in six surface directions, or may be provided as a reflective flip chip light emitting device that emits light in five surface directions.

The reflective flip chip light emitting device that emits light in five surface directions may have a structure in which a reflective layer is disposed in a direction close to the package body 110. For example, the reflective flip chip light emitting device may comprise an insulating reflective layer, such as a Distributed Bragg Reflector, an Omni Directional Reflector, and the like and/or a conductive reflective layer such as Ag, Al, Ni, Au, and the like.

In addition, the flip chip light emitting device that emits light in six surface directions may comprise a first electrode electrically connected to the first conductivity type semiconductor layer and a second electrode electrically connected to the second conductivity type semiconductor layer, and may be provided as a general horizontal light emitting device in which light is emitted between the first electrode and the second electrode.

In addition, the flip chip light emitting device that emits light in six surface directions may be provided as a transmissive flip chip light emitting device including both a reflective region between the first and second bonding parts in which a reflective layer is disposed and a transmissive region in which light is emitted.

Here, the transmissive flip chip light emitting device means a device that emits light to six surfaces including an upper surface, four side surfaces, and a lower surface. In addition, the reflective flip chip light emitting device means a device that emits light to five surfaces including an upper surface and four side surfaces.

Meanwhile, the light emitting device package according to the embodiment can be applied to the light source device.

Further, the light source device may comprise a display device, a lighting device, a head lamp, and the like depending on an industrial field.

As an example of the light source device, a display device may comprise a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may not include a color filter, and may have a structure in which the light emitting device emitting red, green, and blue light are disposed, respectively.

As another example of the light source device, the head lamp may comprise a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source device, the lighting device may comprise a cover, a light source module, a heat radiator, a power supply, an inner case, and a socket. In addition, the light source device according to an embodiment may further include at least one of a member and a holder. The light source module may comprise the light emitting device or the light emitting device package according to the embodiment.

Meanwhile, the light emitting device package according to the embodiment described above may comprise various modifications.

Hereinafter, a modified example of the light emitting device package according to the embodiment will be described with reference to the drawings, and each modified example may be applied to each of the embodiments of the light emitting device package described above. Further, each of the modified examples described below may be applied in combination of a plurality of modified examples within a range that does not conflict with each other.

First, another example of a light emitting device package according to an embodiment of the present invention will be described with reference to FIG. 21. In the description of the light emitting device package according to the embodiment with reference to FIG. 21, descriptions overlapping with those described above may be omitted.

According to the light emitting device package according to the embodiment, a circuit board 420 may be disposed under the package body 110.

For example, in the process in which the package body 110 is mounted on the circuit board 420, the package body 110 may be disposed on the circuit board 420 in a state in which the first and second conductors 311 and 312 are not provided in the first and second openings TH1 and TH2 of the package body 110. The first and second conductors 321 and 322 may be provided on the circuit board 420, and in the process of attaching the package body 110 to the circuit board 420, the first and second conductors 321 and 322 may be moved into the first and second openings TH1 and TH2. Accordingly, the first and second conductors 321 and 322 may be in contact with and electrically connected to the first and second conductive parts 221 and 222 inside the first and second openings TH1 and TH2. Further, the first and second conductors 321 and 322 may be in contact with and electrically connected to the first and second bonding parts 121 and 122.

According to an embodiment, the light emitting device 120 is attached to the package body 110, and the light emitting device package in a state in which the first and second conductors 321 and 322 are not formed may be supplied.

At this time, a first resin 130 may be provided between the light emitting device 120 and the package body 110. The first resin 130 may be disposed in upper regions of the first and second openings TH1 and TH2. In the process in which the light emitting device 120 is provided on the package body 110, a portion of the first resin 130 may be moved to regions of the first and second openings TH1 and TH2. A portion of the first resin 130 may be disposed in lower regions of the first and second bonding parts 121 and 122. In addition, a portion of the first resin 130 may be disposed on side surfaces of the first and second conductive parts 221 and 222.

The first resin 130 may seal the upper regions of the first and second openings TH1 and TH2, and may prevent moisture or foreign substances from flowing from the outside to the region where the light emitting device 120 is disposed through the first and second openings TH1 and TH2.

Next, another example of a light emitting device package according to an embodiment of the present invention will be described with reference to FIG. 22. In describing the light emitting device package according to the embodiment with reference to FIG. 22, descriptions overlapping with those described above may be omitted.

The light emitting device package according to the embodiment may comprise a package body 110 and a light emitting device 120. The package body 110 may comprise first and second openings TH1 and TH2. The light emitting device 120 may comprise first and second bonding parts 121 and 122.

In addition, the light emitting device package according to the embodiment may comprise first and second conductive parts 221 and 222 and first and second conductors 321 and 322.

The first conductive part 221 may be provided in the first opening TH1. The first conductive part 221 may be disposed between the first bonding part 121 and the first conductor 321. The first conductive part 221 may be electrically connected to the first bonding part 121 and the first conductor 321.

The second conductive part 222 may be provided in the second opening TH2. The second conductive part 222 may be disposed between the second bonding part 122 and the second conductor 322. The second conductive part 222 may be electrically connected to the second bonding part 122 and the second conductor 322.

The first conductor 321 and the second conductor 322 may comprise a material selected from a group including Ag, Au, Pt, Sn, Cu, and the like, or an alloy thereof. However, it is not limited thereto, and the first conductor 321 and the second conductor 322 may be formed of a material capable of ensuring a conductive function.

For example, the first conductor 321 and the second conductor 322 may be formed using a conductive paste.

In addition, the light emitting device package according to the embodiment may comprise first and second metal layers 511 and 512 disposed under the package body 110. The first and second metal layers 511 and 512 may be disposed under the first and second openings TH1 and TH2, respectively.

The first and second metal layers 511 and 512 may be disposed spaced apart from each other on the lower surface of the package body 110. The first and second metal layers 511 and 512 may be attached to the lower surface of the package body 110 through, for example, a non-conductive adhesive. For example, the first and second metal layers 511 and 512 may be disposed to extend to the ends of sidewalls of the package body 110.

A first portion of the upper surface of the first metal layer 511 may be disposed under the first opening TH1. The first portion of the upper surface of the first metal layer 511 may be disposed to overlap the first opening TH1 in a vertical direction.

In addition, a second portion of the upper surface of the first metal layer 511 may be disposed under the lower surface of the package body 110. The second portion of the upper surface of the first metal layer 511 may be disposed to overlap the lower surface of the package body 110 in a vertical direction.

A first portion of the upper surface of the second metal layer 512 may be disposed under the second opening TH2. The first portion of the upper surface of the second metal layer 512 may be disposed to overlap the second opening TH2 in a vertical direction.

In addition, a second portion of the upper surface of the second metal layer 512 may be disposed under the lower surface of the package body 110. The second portion of the upper surface of the second metal layer 512 may be disposed to overlap the lower surface of the package body 110 in a vertical direction.

The first and second metal layers 511 and 512 may provide a function of a kind of lead frame. The first and second metal layers 511 and 512 may be electrically connected to the first and second bonding parts 121 and 122, respectively.

For example, in the process in which the first and second metal layers 511 and 512 are attached to the package body 110, the first and second metal layers 511 and 512 may be attached on the lower surface of the package body 110 in a state where the first and second openings TH1 and TH2 of the package body 110 are empty spaces.

Then, the first and second conductors 321 and 322 may be provided on the first and second metal layers 511 and 512 in the first and second openings TH1 and TH2 through a method such as dotting or the like.

Further, in the first and second openings TH1 and TH2, the first and second conductive parts 221 and 222 can be bonded and electrically connected to the first and second conductors 321 and 322, respectively.

In addition, the light emitting device package according to the embodiment may comprise a first resin 130. The first resin 130 may be referred to as an adhesive as described above.

For example, after the light emitting device 120 is attached to the first and second metal layers 521 and 522, the first resin 130 may be provided on the bottom surface of the package body 110. Accordingly, the first resin 130 may be disposed to be moved around the first and second bonding parts 121 and 122 and under the light emitting device 120. In addition, the first resin 130 may be disposed to be moved into the first and second openings TH1 and TH2. The first resin 130 may be disposed around the first and second conductive parts 221 and 222 and on the first and second conductors 321 and 322.

The light emitting device package according to the embodiment may be supplied by being mounted on a sub-mount or a circuit board. In this case, the first and second metal layers 511 and 512 may be electrically connected to first and second pads provided on a sub-mount or a circuit board, respectively.

However, when the light emitting device package is mounted on the submount or the circuit board, a high temperature process such as a reflow process or the like may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package of the embodiment, the first and second bonding parts of the light emitting device according to the embodiment can receive the driving power through the conductive layer disposed in the openings. In addition, the melting point of the conductive layer disposed in the openings may be selected to have a higher value than the melting point of the common bonding material.

Therefore, even when the light emitting device package according to the embodiment is bonded to a main board through a reflow process, re-melting phenomenon does not occur, so there are advantages that electrical connection and physical bonding force are not deteriorated.

In addition, according to the light emitting device package and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the package body 110 can be widened. According to the embodiment, the package body 110 may be provided using not only expensive materials such as ceramics but also relatively inexpensive resin materials.

For example, the package body 110 may comprise at least one material selected from a group including PolyPhtal-Amide (PPA) resin, PolyCyclohexylenedimethylene Terephthalate (PCT) resin, Epoxy Molding Compound (EMC) resin, and Silicone Molding Compound (SMC) resin.

Meanwhile, according to an embodiment, as shown in FIG. 24, the package body 110 may not comprise a cavity, and the upper surface may be provided with a flat surface.

Next, another example of a light emitting device package according to an embodiment of the present invention will be described with reference to FIG. 23. In describing the light emitting device package according to the embodiment with reference to FIG. 23, descriptions overlapping with those described above may be omitted.

The light emitting device package according to the embodiment may comprise a package body 110 and a light emitting device 120. The package body 110 may comprise first and second openings TH1 and TH2. The light emitting device 120 may comprise first and second bonding parts 121 and 122.

In addition, the light emitting device package according to the embodiment may comprise first and second conductive parts 221 and 222 and first and second conductors 321 and 322.

For example, the first and second conductive parts 221 and 222 may be stably bonded to the first and second bonding parts 121 and 122 through separate bonding materials, respectively. Further, the first and second conductive parts 221 and 222 may be provided integrally with the first and second bonding parts 121 and 122.

In addition, the first and second conductive parts 221 and 222 may be provided to the first and second bonding parts 121 and 122 through a plating process. For example, a seed layer may be provided on the first and second bonding parts 121 and 122 at a wafer level where a plurality of light emitting devices are formed, and after a mask layer such as a photoresist film is formed on the seed layer, then a plating process may be performed. After the plating process is performed, the first and second conductive parts 221 and 222 may be formed only in a predetermined region of the first and second bonding parts 121 and 122 through the removal of the photoresist film.

The first conductor 321 and the second conductor 322 may comprise a material selected from a group including Ag, Au, Pt, Sn, Cu, and the like, or an alloy thereof. However, it is not limited thereto, and the first conductor 321 and the second conductor 322 may be formed of a material capable of ensuring a conductive function.

For example, the first conductor 321 and the second conductor 322 may be formed using a conductive paste. The conductive paste may comprise a solder paste, a silver paste, or the like, and may be composed of a multi-layer composed of different materials, or a multi-layer or a single layer composed of an alloy. For example, the first conductor 321 and the second conductor 322 may comprise a SAC (Sn—Ag—Cu) material.

In addition, the light emitting device package according to the embodiment may comprise first and second metal layers 511 and 512 disposed under the package body 110. The first and second metal layers 511 and 512 may be disposed under the first and second openings TH1 and TH2, respectively.

The first and second metal layers 511 and 512 may be disposed spaced apart from each other on the lower surface of the package body 110. The first and second metal layers 511 and 512 may be attached to the lower surface of the package body 110 through, for example, a non-conductive adhesive. For example, the first and second metal layers 511 and 512 may be disposed to extend to the ends of sidewalls of the package body 110.

The first and second metal layers 511 and 512 may provide a function of a kind of lead frame. The first and second metal layers 511 and 512 may be electrically connected to the first and second bonding parts 121 and 122, respectively.

For example, in the process in which the first and second metal layers 511 and 512 are attached to the package body 110, the first and second metal layers 511 and 512 may be attached on the lower surface of the package body 110 in a state where the first and second openings TH1 and TH2 of the package body 110 are empty spaces.

the first and second conductors 321 and 322 may be provided on the first and second metal layers 511 and 512 in the first and second openings TH1 and TH2 through a method such as dotting or the like.

Further, in the first and second openings TH1 and TH2, the first and second conductive parts 221 and 222 can be bonded and electrically connected to the first and second conductors 321 and 322, respectively.

In addition, the light emitting device package according to the embodiment may comprise a first resin 130. The first resin can be referred to as an adhesive as described above.

The light emitting device package according to the embodiment may be supplied by being mounted on a sub-mount or a circuit board. In this case, the first and second metal layers 511 and 512 may be electrically connected to first and second pads provided on a sub-mount or a circuit board, respectively.

However, when the light emitting device package is mounted on the submount or the circuit board, a high temperature process such as a reflow process or the like may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package of the embodiment, the first and second bonding parts of the light emitting device according to the embodiment can receive the driving power through the conductive layer disposed in the openings. In addition, the melting point of the conductive layer disposed in the openings may be selected to have a higher value than the melting point of the common bonding material.

Therefore, even when the light emitting device package according to the embodiment is bonded to a main board through a reflow process, re-melting phenomenon does not occur, so there are advantages that electrical connection and physical bonding force are not deteriorated.

In addition, according to the light emitting device package and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

As a result, the selection range for the material constituting the package body 110 can be widened. According to the embodiment, the package body 110 may be provided using not only expensive materials such as ceramics but also relatively inexpensive resin materials.

For example, the package body 110 may comprise at least one material selected from a group including PolyPhtal-Amide (PPA) resin, PolyCyclohexylenedimethylene Terephthalate (PCT) resin, Epoxy Molding Compound (EMC) resin, and Silicone Molding Compound (SMC) resin. In addition, the package body 110 and the first resin 130 may comprise the same material.

Meanwhile, according to an embodiment, as shown in FIG. 25, the package body 110 may not comprise a cavity, and the upper surface may be provided with a flat surface.

Features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

According to the semiconductor device package and the method of manufacturing the semiconductor device package of the embodiments, there is an advantage that light extraction efficiency, electrical characteristics and reliability can be improved.

According to the semiconductor device package and the method of manufacturing the semiconductor device package of the embodiments, there is an advantage that manufacturing cost can be reduced and manufacturing yield can be improved by improving process efficiency and providing new package structure.

The semiconductor device package according to the embodiment has an advantage that the reflector can be prevented from being discolored by providing the body with high reflectance, thereby improving the reliability of the semiconductor device package.

According to the semiconductor device package and the method of manufacturing the semiconductor device of the embodiments, there is an advantage that re-melting phenomenon can be prevented from occurring in the bonding region of the semiconductor device package in the process of re-bonding the semiconductor device package to a board or the like.

The invention claimed is:

1. A light emitting device package, comprising:
   first and second frames spaced apart from each other and comprising first and second openings, respectively;
   a body disposed between the first and second frames;
   a light emitting device disposed on the body and comprising first and second bonding parts;
   first and second conductors disposed in the first and second openings, respectively; and
   first and second conductive parts extending into the first and second conductors from the first and second bonding parts, respectively, such that lowermost surfaces of the first and second conductive parts are disposed lower than uppermost surfaces of the first and the second conductors.

2. The light emitting device package of claim 1, wherein the first and second conductive parts comprise at least one material selected from a group including Ag, Au, and Cu.

3. The light emitting device package of claim 1, wherein uppermost surfaces of the first and second conductive parts comprise a flat surface.

4. The light emitting device package of claim 1, wherein a thickness of the first and second conductive parts is several tens of micrometers to several hundreds of micrometers.

5. The light emitting device package of claim 1, wherein the first and second conductive parts and the first and second bonding parts comprise different materials from each other.

6. The light emitting device package of claim 1, wherein an area of upper surfaces of the first and second conductive parts is larger than an area of lower surfaces of the first and second conductors.

7. The light emitting device package of claim 1, wherein a distance between the first conductive part and the first opening on an upper surface of the first frame is several tens of micrometers.

8. The light emitting device package of claim 1, wherein the first conductor is disposed in direct contact with the first bonding part and the first conductive part.

9. The light emitting device package of claim 1, wherein a width of the first bonding part parallel to a major axis direction of the light emitting device is larger than a width of the first opening parallel to the major axis direction of the light emitting device.

10. A light emitting device package, comprising:
first and second frames spaced apart from each other and comprising first and second openings, respectively;
a body disposed between the first and second frames;
a light emitting device disposed on the body and comprising first and second bonding parts;
first and second conductive parts disposed under the first and second bonding parts; and
first and second conductors disposed in the first and second openings, respectively,
wherein the first and second conductive parts extend into the first and second openings from the first and second bonding parts, respectively,
wherein the first and second conductors are disposed between the first and second conductive parts and the first and second frames, respectively,
wherein the body comprises a recess concaved toward a lower surface from an upper surface of the body, and
comprising a first resin provided in the recess and disposed in direct contact with a lower surface of the light emitting device.

11. A light emitting device package, comprising:
first and second frames spaced apart from each other and comprising first and second openings, respectively;
a body disposed between the first and second frames;
a light emitting device disposed on the body and comprising first and second bonding parts;
first and second conductors disposed in the first and second openings, respectively; and
first and second conductive parts extending into the first and second conductors from the first and second bonding parts such that the first and second conductors completely surround side surfaces and bottom surface of the first and second conductive parts, respectively,
wherein a thickness of the first and second conductive parts is provided several tens of micrometers to several hundreds of micrometers, and
wherein a distance between the first conductive part and the first opening on an upper surface of the first frame is provided several tens of micrometers.

12. The light emitting device package of claim 11, wherein the first and second conductive parts comprise at least one material selected from a group including Ag, Au, and Cu.

13. The light emitting device package of claim 11, wherein uppermost surfaces of the first and second conductive parts comprise a flat surface.

14. The light emitting device package of claim 11, wherein the first and second conductive parts and the first and second bonding parts comprise different materials from each other.

15. The light emitting device package of claim 11, wherein an area of upper surfaces of the first and second conductive parts is larger than an area of lower surfaces of the first and second conductors.

16. The light emitting device package of claim 11, wherein the first conductor is disposed in direct contact with the first bonding part and the first conductive part.

17. The light emitting device package of claim 11, wherein a width of the first bonding part parallel to a major axis direction of the light emitting device is larger than a width of the first opening parallel to the major axis direction of the light emitting device.

18. The light emitting device package of claim 11, wherein the body comprises a recess concaved toward a lower surface from an upper surface of the body, and
comprising a first resin provided in the recess and disposed in direct contact with a lower surface of the light emitting device.

* * * * *